United States Patent
Koyama et al.

(10) Patent No.: US 7,324,097 B2
(45) Date of Patent: *Jan. 29, 2008

(54) LEVEL SHIFTER

(75) Inventors: Jun Koyama, Kanagawa (JP);
Munehiro Azami, Kanagawa (JP);
Yutaka Shionoiri, Kanagawa (JP);
Tomoaki Atsumi, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 535 days.

This patent is subject to a terminal disclaimer.

(21) Appl. No.: 10/833,862

(22) Filed: Apr. 28, 2004

(65) Prior Publication Data

US 2004/0201410 A1    Oct. 14, 2004

Related U.S. Application Data

(63) Continuation of application No. 09/891,560, filed on Jun. 26, 2001, now Pat. No. 6,731,273.

(51) Int. Cl.
*G09G 5/00*    (2006.01)

(52) U.S. Cl. .................... 345/204; 345/100

(58) Field of Classification Search .......... 345/87–100, 345/204, 205, 211, 212; 327/333; 323/311, 323/312, 313
See application file for complete search history.

(56) References Cited

U.S. PATENT DOCUMENTS

| | | | |
|---|---|---|---|
| 5,399,915 A | 3/1995 | Yahata | 327/108 |
| 5,680,149 A | 10/1997 | Koyama et al. | 345/98 |
| 6,137,360 A | 10/2000 | Memida | |
| 6,262,598 B1 | 7/2001 | Cairns et al. | 326/81 |
| 6,300,927 B1 | 10/2001 | Kubota et al. | 345/92 |
| 6,384,808 B2 | 5/2002 | Azami | 345/100 |
| 6,392,625 B1 | 5/2002 | Sato et al. | 345/94 |
| 6,476,637 B1 | 11/2002 | Brownlow et al. | 326/81 |
| 6,617,878 B2 | 9/2003 | Brownlow et al. | 326/68 |
| 6,980,194 B2 * | 12/2005 | Tobita | 345/100 |

FOREIGN PATENT DOCUMENTS

KR    1998-041916    8/1998

* cited by examiner

*Primary Examiner*—Richard Hjerpe
*Assistant Examiner*—Jean Lesperance
(74) *Attorney, Agent, or Firm*—Cook, Alex, McFarron, Manzo, Cummings & Mehler, Ltd.

(57) ABSTRACT

A level shifter that accommodates lower driving voltage of a driver circuit and has a sufficient capability of converting the amplitude of an input signal even when the voltage amplitude of the input signal is low is provided. A level shifter utilizing a current mirror circuit 150 and a differential circuit 160 is used in a portion for converting the voltage amplitude of the signal. Since the potential difference of a signal input through transistors 105 and 106 to the differential circuit 120 is amplified and outputted, the voltage amplitude can be normally converted without influence of the threshold of a transistor even when the voltage amplitude of the input signal is low.

45 Claims, 22 Drawing Sheets

Fig. 2B

□ : the first input signal (In1)   ■ : the second input signal (In2)

○ : V$_{306}$   ● : V$_{307}$

◇ : output of level shifter according to the present invention
◆ : output of conventional level shifter ◇ : buffer output of level shifter at a subsequent stage according to the present invention
◆ : buffer output of conventional level shifter at a subsequent stage □ : the first input signal (In3)   ■ : the second input signal (In4)

○ :V506   ● :V507

● :V706   ○ :V707

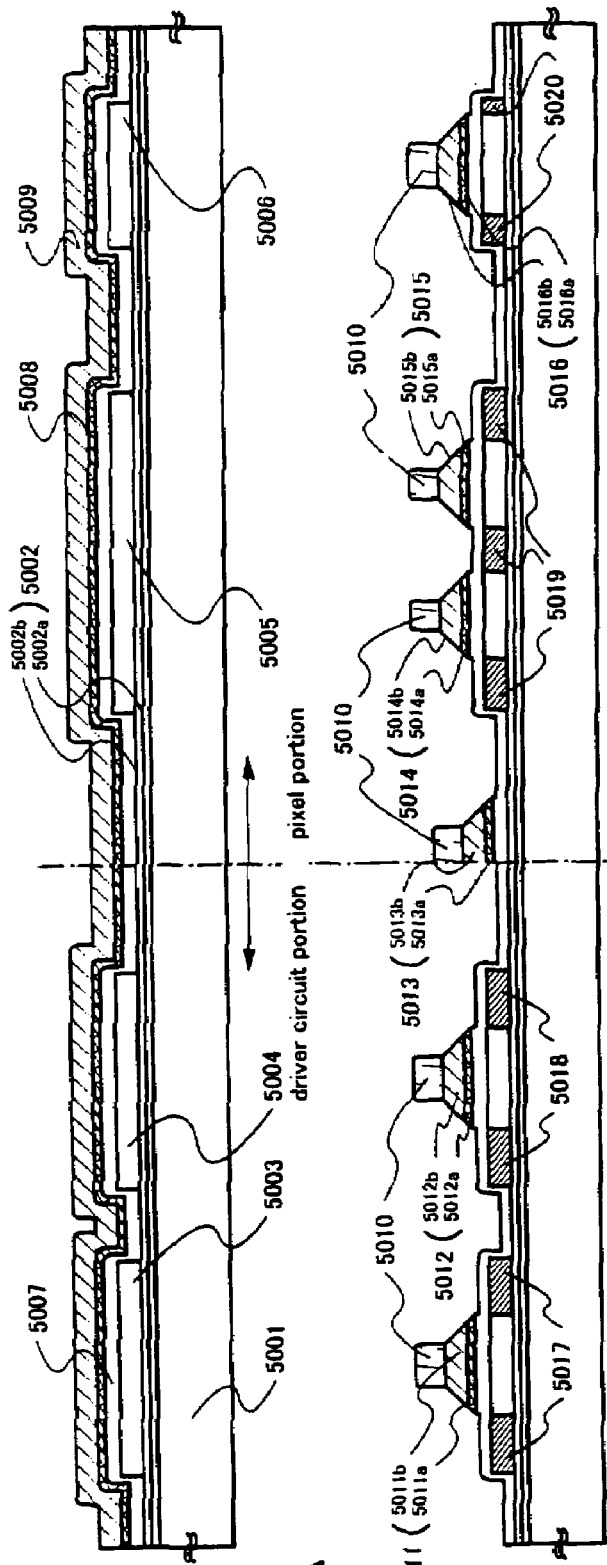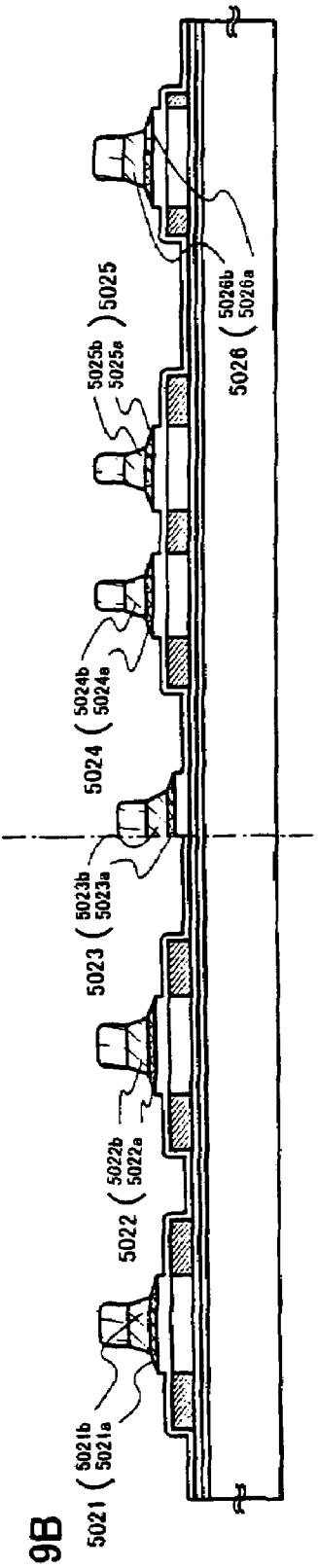
Fig. 9A
Fig. 9B
Fig. 9C

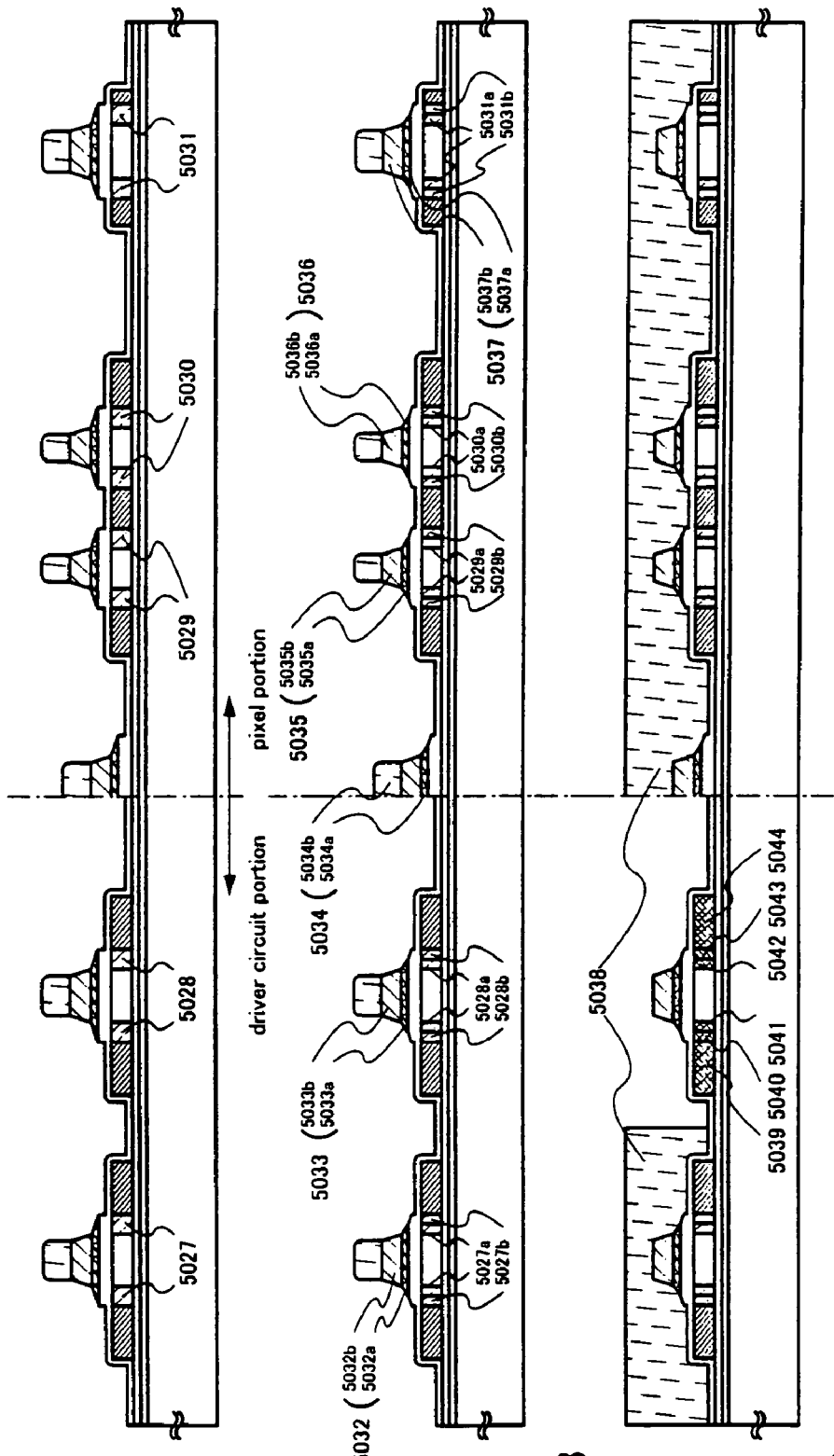

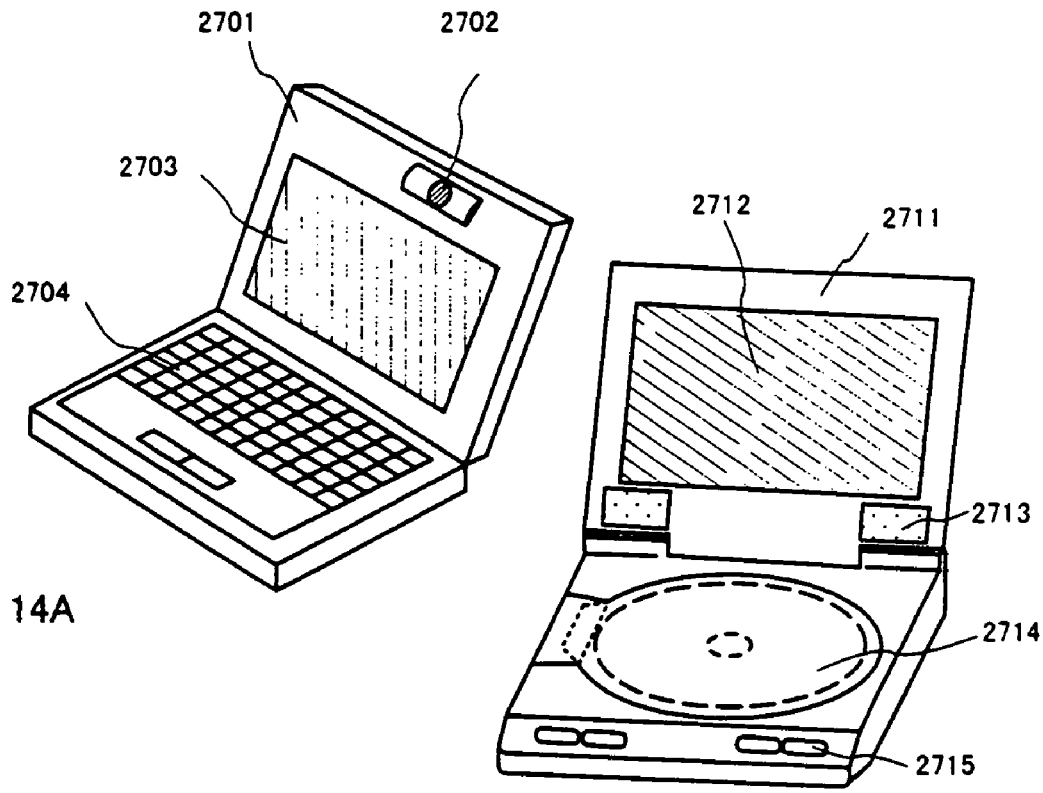
Fig 14A
Fig. 14B
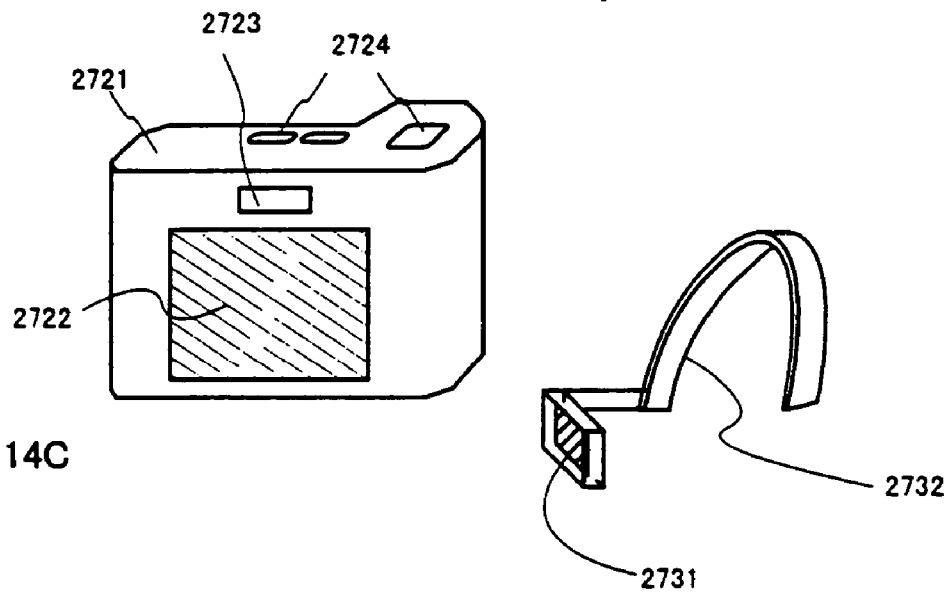
Fig. 14C
Fig. 14D

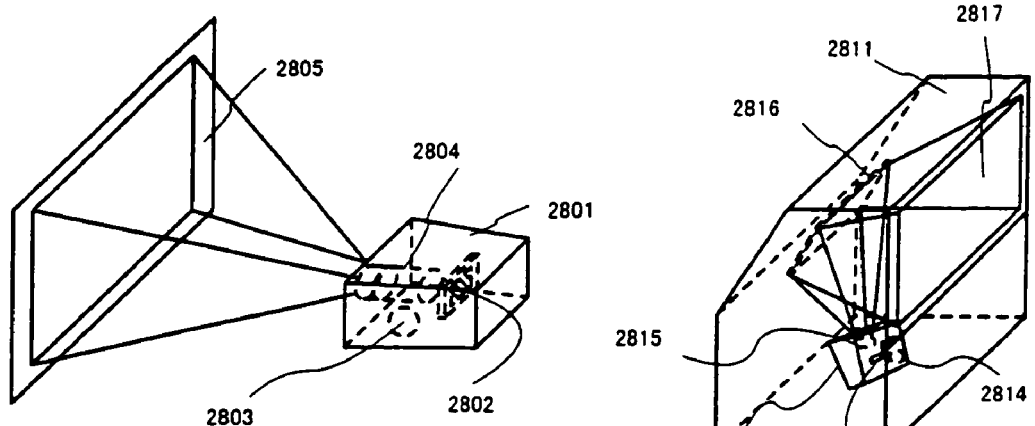
Fig. 15A
Fig. 15B
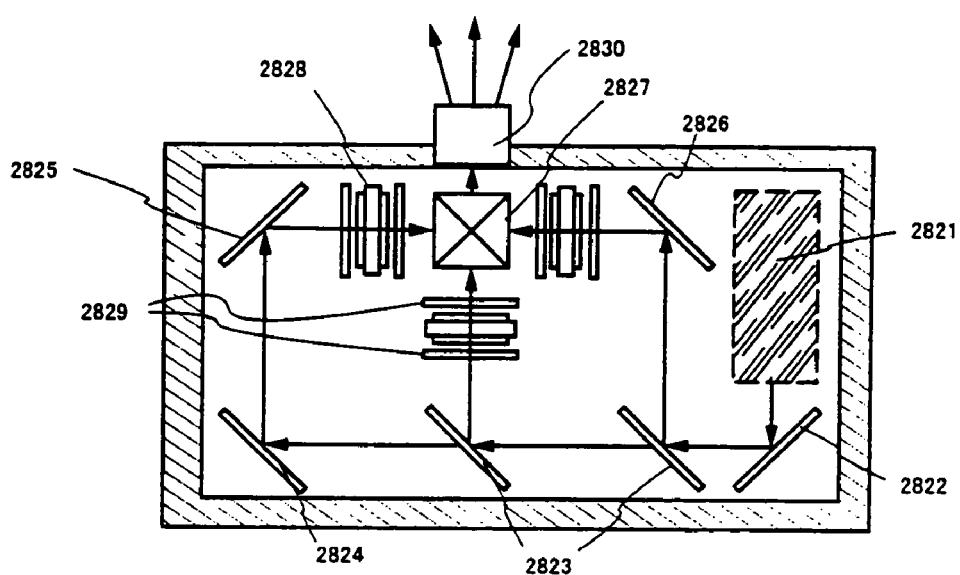
Fig. 15C
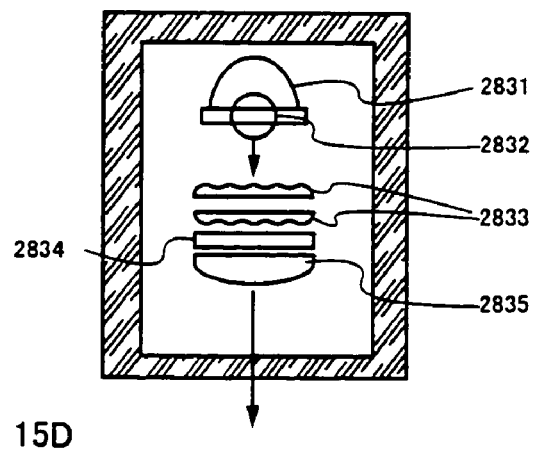
Fig. 15D

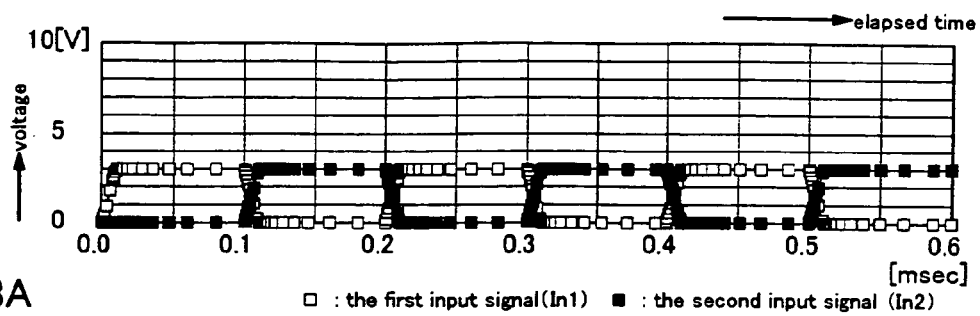
Fig. 18A   □ : the first input signal (In1)   ■ : the second input signal (In2)
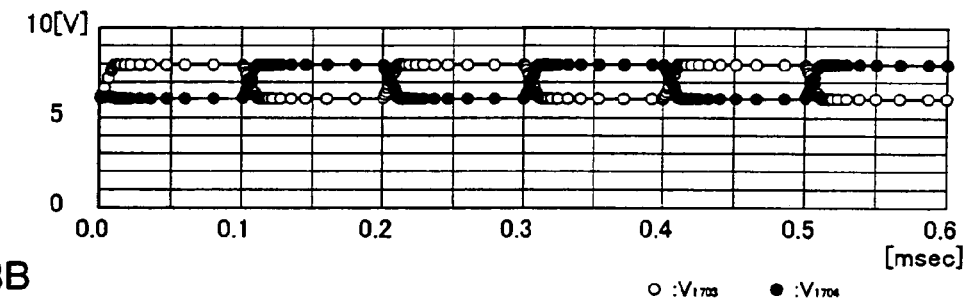
Fig. 18B   ○ : $V_{1703}$   ● : $V_{1704}$
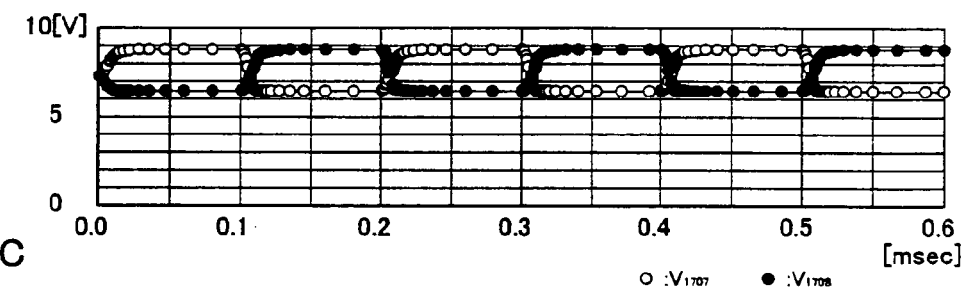
Fig. 18C   ○ : $V_{1707}$   ● : $V_{1708}$
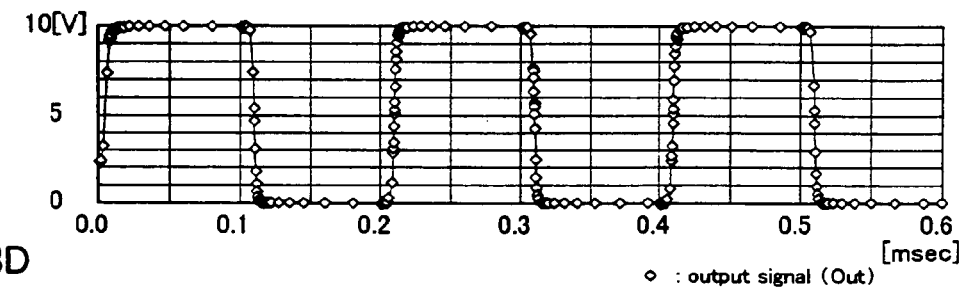
Fig. 18D   ◇ : output signal (Out)

LEVEL SHIFTER

This application is a continuation of U.S. application Ser. No. 09/891,560, filed on Jun. 26, 2001 now U.S. Pat. No. 6,731,273

BACKGROUND OF THE INVENTION

1. Field of the Invention

The present invention relates to a level shifter used in a driver circuit for a display device, and in particular, to a level shifter used in a driver circuit for a display device, the driver circuit using thin film transistors (hereinafter referred to as TFTs) formed on an insulator. It is to be noted that, in this specification, a display device means one used as an LCD (a liquid crystal display), an OLED (an organic EL display), or the like.

2. Description of the Related Art

Recently, semiconductor microfabrication technology has been advanced, which is accompanied by miniaturization of LSIs. This results in more active application of such LSIs to small-sized apparatus such as personal digital assistants, which requires lower power consumption of such LSIs. Today, LSIs driven at low power supply voltage such as 3.3 V are mainly used.

On the other hand, with regard to LCDs (liquid crystal displays) the demands for which are remarkably increasing these days in the field of personal digital assistants, monitors for computers, and the like, liquid crystal is often driven by a signal having the voltage amplitude of 10 V-20 V. Therefore, a driver circuit of such liquid crystal includes at least a circuit portion driven by high power supply voltage.

Accordingly, it is indispensable that a controller LSI using the abovementioned LSI which is driven at low power supply voltage is connected to a circuit for driving the liquid crystal which is driven at high power supply voltage through a level shifter for changing the amplitude voltage of the signal.

FIGS. 12A and 12B illustrate circuit diagrams of commonly used level shifters. It is to be noted that in this specification each power supply potential is denoted as VDD# (# is a numeral) or GND. Here, VDD1, VDD2, VDD3, and VDD4 are used wherein VDD4<VDD3<GND<VDD1<VDD2. For the sake of simplicity, GND is fixed to 0 V.

The level shifter illustrated in FIG. 12A converts an input signal having the voltage amplitude of GND-VDD1 into an output signal having the voltage amplitude of GND-VDD2. More specifically, the amplitude is converted by fixing the lower potential side and converting the potential at the higher potential side. The level shifter is structured as follows. Both of a source region of a first p-type TFT 1201 and a source region of a second p-type TFT 1202 are connected to the power supply VDD2. A drain region of the first p-type TFT 1201 is connected to a source region of a third p-type TFT 1203, and a drain region of the second p-type TFT 1202 is connected to a source region of a fourth p-type TFT 1204. A drain region of the third p-type TFT 1203 is connected to a drain region of a first N type thin film transistor (hereinafter referred to as an n-type TFT) and a gate electrode of the second p-type TFT 1202. A drain region of the fourth p-type TFT 1204 is connected to a drain region of a second n-type TFT 1206 and a gate electrode of the first p-type TFT 1201. Both of a source region of the first n-type TFT 1205 and a source region of the second n-type TFT 1206 are connected to GND (=0 V). An input signal (In) is input to a gate electrode of the third p-type TFT 1203 and a gate electrode of the first n-type TFT 1205. An inverted signal of the input signal (Inb) is input to a gate electrode of the fourth p-type TFT 1204 and a gate electrode of the second N-type TFT 1206. An output signal (Out) is taken out from the drain region of the fourth n-type TFT 1204. Here, an inverted output signal (Outb) can also be taken out from the drain region of the third p-type TFT 1203.

It is to be noted that, though there are n-type and p-type as the conductive types of a TFT, in this specification, in the case where the polarity of a TFT is not specifically limited, the conductive types are described as a first conductive type and a second conductive type. For example, when the first conductive type TFT is of the n-type, the second conductive type means the p-type. Conversely, when the first conductive type TFT is of the p-type, the second conductive type means the n-type.

Next, basic operation of the conventional level shifter is described. When an Hi signal is input as the input signal (In), the n-type TFT 1205 is in a conductive state while the p-type TFT 1203 is in a nonconductive state. Therefore, a signal having the potential of GND, that is, an Lo signal, is input to the gate electrode of the p-type TFT 1202, and the p-type TFT 1202 is in a conductive state. On the other hand, here, the inverted input signal (Inb) is an Lo signal. Therefore, the n-type TFT 1206 is in a nonconductive state while the p-type TFT 1204 is in a conductive state. Since both of the p-type TFTs 1202 and 1204 are in a conductive state, an Hi signal is outputted as the output signal (Out) with the potential of VDD2. It is to be noted that the p-type TFT 1201 is in a nonconductive state, which assures that the potential of the gate electrode of the p-type TFT 1202 is held at Lo=GND.

When the potential of the input signal (In) is Lo, since the level shifter illustrated in FIG. 12A is structured to be symmetrical, an Lo signal is outputted from the output terminal (Out) with the potential of GND, that is, 0 V.

In this way, an input signal having the voltage amplitude of GND-VDD1 is converted into an output signal having the voltage amplitude of GND-VDD2.

Next, the level shifter illustrated in FIG. 12B converts an input signal having the voltage amplitude of VDD3-GND into an output signal having the voltage amplitude of VDD4-GND. More specifically, the amplitude is converted by fixing the higher potential side and converting the potential at the lower potential side. The level shifter is structured as follows. Both of a source region of a first n-type thin film transistor (hereinafter referred to as an n-type TFT) 1211 and a source region of a second n-type TFT 1212 are connected to a power supply VDD4. A drain region of the first n-type TFT 1211 is connected to a source region of a third n-type TFT 1213, and a drain region of the second n-type TFT 1212 is connected to a source region of a fourth n-type TFT 1214. A drain region of the third n-type TFT 1213 is connected to a drain region of a first p-type thin film transistor (hereinafter referred to as a p-type TFT) 1215 and a gate electrode of the second n-type TFT 1212. A drain region of the fourth n-type TFT 1214 is connected to a drain region of a second p-type TFT 1216 and a gate electrode of the first n-type TFT 1211. Both of a source region of the first p-type TFT 1215 and a source region of the second p-type TFT 1216 are connected to GND (=0 V). An input signal (In) is input to a gate electrode of the third n-type TFT 1213 and a gate electrode of the first p-type TFT 1215. An inverted signal of the input signal (Inb) is input to a gate electrode of the fourth n-type TFT 1214 and a gate electrode of the second p-type TFT 1216. An output signal (Out) is taken out from the drain region of the fourth n-type TFT 1214. Here, an inverted output signal (Outb) can also be taken out from the drain region of the third n-type TFT 1213.

Next, basic operation of the conventional level shifter is described. When an Lo signal is input as the input signal (In), the p-type TFT 1215 is in a conductive state while the n-type TFT 1213 is in a nonconductive state. Therefore, a signal having the potential of GND, that is, an Hi signal, is input to the gate electrode of the n-type TFT 1212, and the n-type TFT 1212 is in a conductive state. On the other hand, here, the inverted input signal (Inb) is an Hi signal at this time. Therefore, the p-type TFT 1216 is in a nonconductive state while the n-type TFT 1214 is in a conductive state. Since both of the n-type TFTs 1212 and 1214 are in a conductive state, an Lo signal is outputted as the output signal (Out) with the potential of VDD4. It is to be noted that the n-type TFT 1211 is in a nonconductive state, which assures that the potential of the gate electrode of the n-type TFT 1212 is held at Hi=GND.

When the potential of the input signal (In) is Hi, since the level shifter illustrated in FIG. 12B is structured to be symmetrical, an Hi signal is outputted from the output terminal (Out) with the potential of GND, that is, 0 V.

In this way, an input signal having the voltage amplitude of VDD3-GND is converted into an output signal having the voltage amplitude of VDD4-GND.

A problem with regard to the level shifters illustrated in FIGS. 12A and 12B is now described. It is to be noted that, since the problem is common to the level shifters illustrated in FIGS. 12A and 12B, only the one illustrated in FIG. 12A is described by way of example. As described in the above, today, controller LSIs operating at 3.3 V are mainly used. Suppose the level shifter illustrated in FIG. 12A carries out conversion in case of VDD1=3 V and VDD2=10 V. When the amplitude of the input signal to the TFTs 1203, 1204, 1205, and 1206 is 3 V and the threshold voltage of the n-type TFTs 1205 and 1206 is 3 V, the level shifter is not expected to operate normally. More specifically, since, as the voltage amplitude before conversion becomes smaller, the gate-source voltage becomes less likely to be high enough to make the TFTs sufficiently conductive, normal operation becomes more difficult.

SUMMARY OF THE INVENTION

Accordingly, an object of the present invention is to provide a novel level shifter the normal operation of which can be guaranteed even in case a driver circuit is driven at lower power supply voltage, which is accompanied by a lower voltage amplitude of an input signal.

In order to solve the above problem, the present invention is structured as in the following.

In the conventional level shifter, an input signal is input to gate electrodes of TFTs 1203, 1204, 1205, and 1206 in FIG. 12A. When the voltage amplitude of the input signal becomes lower than the absolute values of the thresholds of the TFTs, gate-source voltage high enough to make the TFTs sufficiently conductive can not be obtained, which makes normal operation impossible.

Therefore, in a level shifter according to the present invention, the paths of the input signal are contrived to make the thresholds of the TFTs less liable to have the adverse effect even when the voltage amplitude of the input signal becomes lower. Further, in converting the voltage amplitude, by using a differential amplifier circuit which is a combination of a current mirror circuit and a differential circuit, high gain can be obtained.

The configuration of the level shifter of the present invention is disclosed hereinbelow.

According to the first aspect of this invention, a level shifter for converting a signal having a low voltage amplitude into a signal having a high voltage amplitude and for outputting the converted signal, comprising:

a current mirror circuit;

a differential circuit having the current mirror circuit as a load;

a first current source for supplying current to the differential circuit; and first and second source follower circuits, is characterized in that:

a first input signal is input through the first source follower circuit to the differential circuit; and a second input signal is input through the second source follower circuit to the differential circuit.

According to a second aspect of the present invention, a level shifter for converting a signal having a low voltage amplitude into a signal having a high voltage amplitude and for outputting the converted signal, comprising:

a current mirror circuit;

a differential circuit having the current mirror circuit as a load;

a first current source for supplying current to the differential circuit;

first and second transistors, a gate electrode and a drain region of the first transistor being electrically connected to each other and a gate electrode and a drain region of the second transistor being electrically connected to each other; and second and third current sources for supplying current to the first and second transistors, respectively, is characterized in that:

a first input signal is input through the first transistor to the differential circuit; and a second input signal is input through the second transistor to the differential circuit.

According to a third aspect of the present invention, a level shifter for converting a signal having a low voltage amplitude into a signal having a high voltage amplitude and for outputting the converted signal, comprising:

a current mirror circuit;

a differential circuit having the current mirror circuit as a load;

a first current source for supplying current to the differential circuit;

first and second transistors, a gate electrode and a drain region of the first transistor being electrically connected to each other and a gate electrode and a drain region of the second transistor being electrically connected to each other; and second and third current sources for supplying current to the first and second transistors, respectively, is characterized in that:

the differential circuit comprises third and fourth transistors;

a drain region of the first transistor and a gate electrode of the third transistor are electrically connected to each other;

a drain region of the second transistor and a gate electrode of the fourth transistor are electrically connected to each other;

a first input signal is input through the first transistor to the gate electrode of the third transistor; and a second input signal is input through the second transistor to the gate electrode of the fourth transistor.

According to a fourth aspect of the present invention, a level shifter for converting a signal having a low voltage amplitude into a signal having a high voltage amplitude and for outputting the converted signal, comprising:

a first transistor of a first conductive type, a gate electrode and a drain region thereof being electrically connected to each other;

a second transistor of the first conductive type, a gate electrode and a drain region thereof being electrically connected to each other;

a differential circuit comprising a third transistor of the first conductive type and a fourth transistor of the first conductive type;

a current mirror circuit comprising a fifth transistor of a second conductive type and a sixth transistor of the second conductive type, a gate electrode and a drain region of the fifth transistor being connected to each other;

a seventh transistor of the first conductive type for electrically connecting the differential circuit and a first current source;

an eighth transistor of the second conductive type for electrically connecting the fifth transistor and a second current source;

a ninth transistor of the second conductive type for electrically connecting the sixth transistor and a third current source; and a power supply portion for supplying potential to gate electrodes of the seventh, eighth, and ninth transistors, is characterized in that:

a first input signal is input through the first transistor to a gate electrode of the third transistor; and a second input signal is input through the second transistor to a gate electrode of the fourth transistor.

According to a fifth aspect of the present invention, a level shifter for converting a signal having a low voltage amplitude into a signal having a high voltage amplitude and for outputting the converted signal, comprising:

first and second current mirror circuits;

a differential circuit electrically connected to the first and second current mirror circuits;

a first current source for supplying current to the differential circuit;

first and second transistors, a gate electrode and a drain region of the first transistor being electrically connected to each other and a gate electrode and a drain region of the second transistor being electrically connected to each other; and second and third current sources for supplying current to the first and second transistors, respectively, is characterized in that:

a first input signal is input through the first transistor to the differential circuit; and a second input signal is input through the second transistor to the differential circuit.

According to a sixth aspect of the present invention, a level shifter for converting a signal having a low voltage amplitude into a signal having a high voltage amplitude and for outputting the converted signal, comprising:

first and second current mirror circuits;

a differential circuit electrically connected to the first and second current mirror circuits;

a first current source for supplying current to the differential circuit;

first and second transistors, a gate electrode and a drain region of the first transistor being electrically connected to each other and a gate electrode and a drain region of the second transistor being electrically connected to each other; and second and third current sources for supplying current to the first and second transistors, respectively, is characterized in that:

the differential circuit comprises third and fourth transistors;

a drain region of the first transistor and a gate electrode of the third transistor are electrically connected to each other;

a drain region of the second transistor and a gate electrode of the fourth transistor are electrically connected to each other;

a first input signal is input through the first transistor to the gate electrode of the third transistor; and a second input signal is input through the second transistor to the gate electrode of the fourth transistor.

According to a seventh aspect of the present invention, a level shifter for converting a signal having a low voltage amplitude into a signal having a high voltage amplitude and for outputting the converted signal, comprising:

a current mirror circuit;

a differential circuit having the current mirror circuit as a load;

a first current source for supplying current to the differential circuit;

first and second source follower circuits; and a transistor for reset, is characterized in that:

a first input signal is input through the first source follower circuit to the differential circuit;

a second input signal is input through the second source follower circuit to the differential circuit; and during a period where voltage amplitude of an input signal is not converted, current supply by the first current source is blocked by a reset signal input to the transistor for reset.

According to an eighth aspect of the present invention, a level shifter for converting a signal having a low voltage amplitude into a signal having a high voltage amplitude and for outputting the converted signal, comprising:

a current mirror circuit;

a differential circuit having the current mirror circuit as a load;

a first current source for supplying current to the differential circuit;

first and second transistors, a gate electrode and a drain region of the first transistor being electrically connected to each other and a gate electrode and a drain region of the second transistor being electrically connected to each other; and second and third current sources for supplying current to the first and second transistors, respectively, is characterized in that:

a first input signal is input through the first transistor to the differential circuit;

a second input signal is input through the second transistor to the differential circuit; and during a period where voltage amplitude of an input signal is not converted, current supply by the first, second, and third current sources is blocked.

According to a ninth aspect of the present invention, a level shifter for converting a signal having a low voltage amplitude into a signal having a high voltage amplitude and for outputting the converted signal, comprising:

a first transistor of a first conductive type, a gate electrode and a drain region thereof being connected to each other;

a second transistor of the first conductive type, a gate electrode and a drain region thereof being connected to each other;

a differential circuit comprising a third transistor of the first conductive type and a fourth transistor of the first conductive type;

a current mirror circuit comprising a fifth transistor of a second conductive type and a sixth transistor of the second conductive type, a gate electrode and a drain region of the fifth transistor being connected to each other;

a seventh transistor of the first conductive type for connecting the differential circuit and a first current source;

an eighth transistor of the second conductive type for electrically connecting the fifth transistor and a second current source;

a ninth transistor of the second conductive type for electrically connecting the sixth transistor and a third current source;

a power supply portion for supplying potential to gate electrodes of the seventh, eighth, and ninth transistors;

a first transistor for reset of the second conductive type; and a second transistor for reset of the first conductive type, is characterized in that:

a drain region of the first transistor and a gate electrode of the third transistor are electrically connected to each other;

a drain region of the second transistor and a gate electrode of the fourth transistor are electrically connected to each other;

a source region of the first transistor for reset is electrically connected to source regions of the seventh and eighth transistors, and a drain region of the first transistor for reset is electrically connected to gate electrodes of the seventh and eighth transistors;

a source region of the second transistor for reset is electrically connected to a source region of the ninth transistor, and a drain region of the second transistor for reset is electrically connected to a gate electrode of the ninth transistor;

a first input signal is input through the first transistor to the gate electrode of the third transistor;

a second input signal is input through the second transistor to the gate electrode of the fourth transistor; and during a period where voltage amplitude of an input signal is not converted, current supply is blocked by a reset signal input to the first and second transistors for reset, and by making the seventh, eighth, and ninth transistors in a nonconductive state.

According to a tenth aspect of the present invention, a level shifter is characterized in that the first input signal is a signal having a low voltage amplitude, and the second input signal is a signal having a low voltage amplitude and in an opposite phase to that of the first input signal.

According to an eleventh aspect of the present invention, a level shifter is characterized in that the first input signal is a signal having a low voltage amplitude and the second input signal is a signal having a constant potential in a range of the amplitude of the first input signal.

According to a twelfth aspect of the present invention, a level shifter is characterized in that voltage amplitude of the input signal is 5V or lower.

BRIEF DESCRIPTION OF THE DRAWINGS

In the accompanying drawings:

FIGS. 9A to 9C illustrate an exemplary manufacturing process of an active matrix substrate of Embodiment 4 according to the present invention;

FIGS. 10A to 10C illustrate an exemplary manufacturing process of the active matrix substrate of Example 4 according to the present invention;

FIGS. 14A to 14D illustrate electronic equipment of Example 11 according to the present invention;

FIGS. 15A to 15D illustrates electronic equipment of Example 11 according to the present invention;

FIGS. 18A to 18D illustrate the result of a simulation of potentials when the level shifter illustrated in FIG. 17 is driven;

DETAILED DESCRIPTION OF THE PREFERRED EMBODIMENTS

Figure 1:
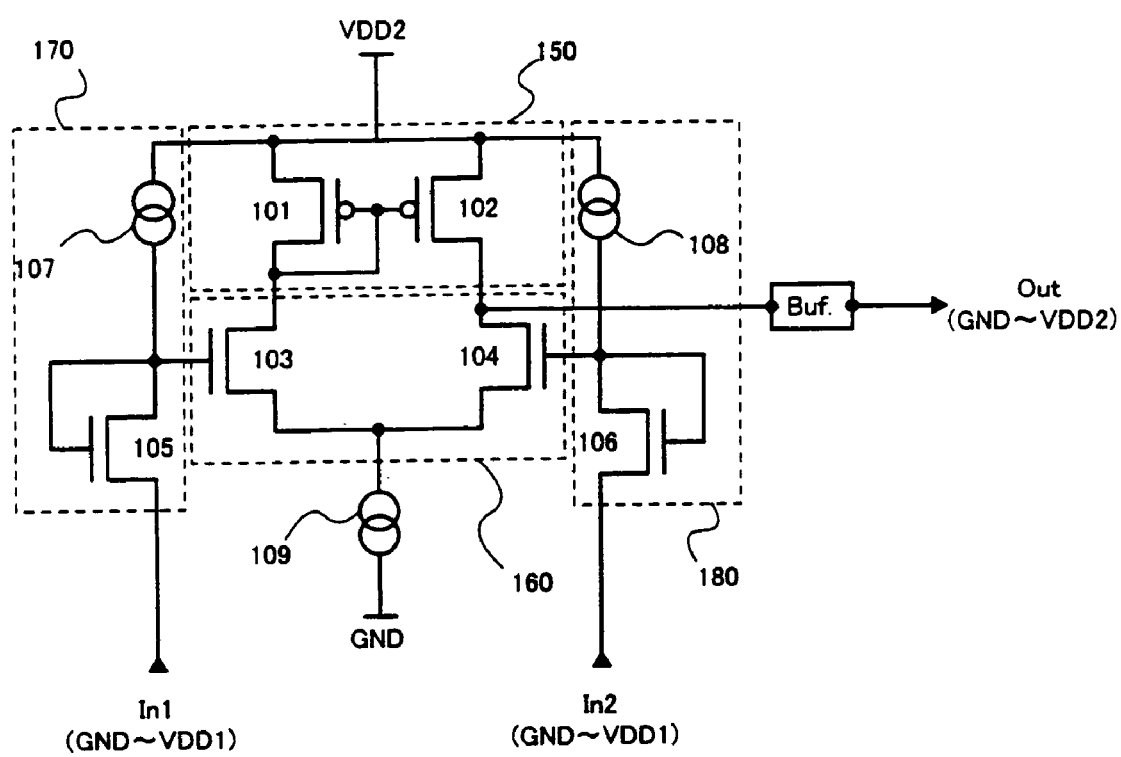
FIG. 1 is a circuit diagram of a level shifter having two input terminals and one output terminal according to the present invention.

FIG. 1 is a circuit diagram of a level shifter according to the present invention. Here, GND (=0 V), VDD1, and VDD2 are used as power supply potentials wherein GND<VDD1<VDD2. The level shifter according to the present invention comprises a current mirror circuit surrounded by a broken line frame 150, a differential circuit surrounded by a broken line frame 160, a first source follower circuit surrounded by a broken line frame 170, a second source follower circuit surrounded by a broken line frame 180, and a current source 109. The current mirror circuit 150 and the differential circuit 160 form a differential amplifier circuit for converting the voltage amplitude of a signal.

A source region of a p-type TFT 101 and a source region of a p-type TFT 102 are connected to a power supply VDD2. A gate electrode of the p-type TFT 101 and a gate electrode of the p-type TFT 102 are electrically connected to each other, and are electrically connected to a drain region of the p-type TFT 101 and a drain region of an n-type TFT 103. A drain region of the p-type TFT 102 is electrically connected to a drain region of an n-type TFT 104 at a node, where output (Out) is obtained. A source region of the n-type TFT 103 and a source region of the n-type TFT 104 are electrically connected to the current source 109. A first input signal (In1) is input to a source region of an n-type TFT 105, while a second input signal (In2) is input to a source region of an n-type TFT 106. Both of a gate electrode and a drain region of the n-type TFT 105 are electrically connected to a current source 107 and a gate electrode of the n-type TFT 103. Both of a gate electrode and a drain region of the n-type TFT 106 are electrically connected to a current source 108 and a gate electrode of the n-type TFT 104.

Basic operation of the level shifter according to the present invention is now described with reference to FIG. 1 and FIGS. 2A to 2D. First, a signal having the amplitude of GND-VDD1 is input from the first input terminal (In1). Constant current is supplied to the differential circuit portion 160 from the current source 109. On the other hand, in the first and second source follower circuits 170 and 180, the gate electrode and a drain region of the n-type TFT 105 are connected to each other, and the gate electrode and the drain region of the n-type TFT 106 are connected to each other. Therefore, both of the two TFTs 105 and 106 operate in a saturated region. Therefore, the potential obtained by dividing the voltage between VDD2 and the first input terminal (In1) by the resistances is input to the gate electrode of the n-type TFT 103. This potential is represented as $V_{103}$. Similarly, a signal is input from the second input terminal (In2). In the same way as the case of the first input signal, the potential obtained by dividing the voltage between VDD2 and the second input terminal (In2) by the resistances is input to the gate electrode of the n-type TFT 104. This potential is represented as $V_{104}$.

The potentials of $V_{103}$ and $V_{104}$ are as illustrated in FIG. 2B. The operation of the differential amplifier circuit formed of the current mirror circuit surrounded by the broken line frame 150 and the differential circuit surrounded by the broken line frame 160 in FIG. 1 is now described. The source region of the n-type TFT 103 and the source region of the n-type TFT 104 of the differential circuit are connected to the current source 109. Therefore, constant current always passes through the two TFTs 103 and 104. Here, when the first input signal is Hi and the second input signal is Lo, $V_{103}>V_{104}$ is satisfied with regard to the potentials input to the differential circuit. Therefore, the gate-source voltage of the n-type TFT 103 becomes higher while the gate-source voltage of the n-type TFT 104 becomes lower. Therefore, current $I_{103}$ through the n-type TFT 103 is increased while current $I_{104}$ through the n-type TFT 104 is decreased. Here, the current mirror circuit makes current which is equal to $I_{103}$ pass through the p-type TFTs 101 and 102. Therefore, the current which equals to the difference between $I_{103}$ and $I_{104}$ passes through the output terminal (Out).

Figure 2A:
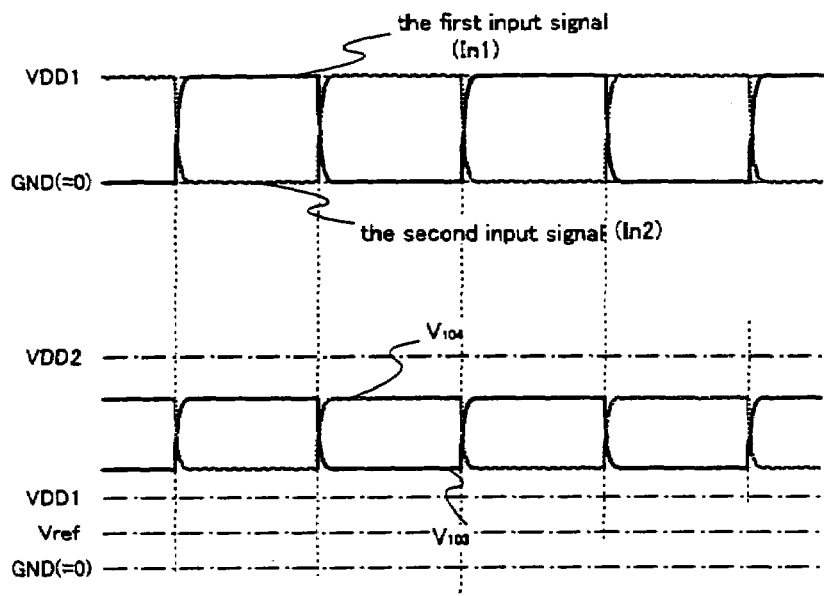
FIG. 2 is schematic graphs illustrating potentials when the level shifter illustrated in FIG. 1 is driven;.
Figure 2C:
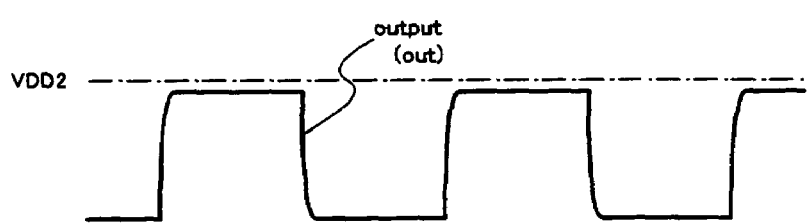
Figure 2D:
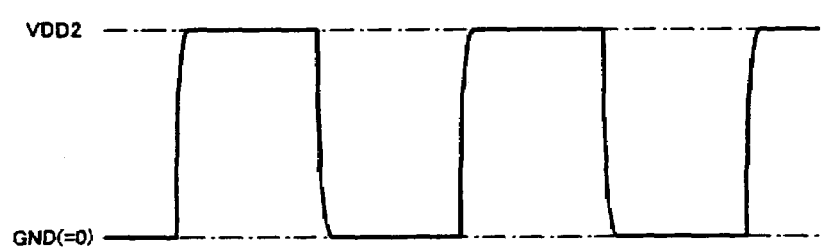

When the first input signal is Hi and the second input signal is Lo, $I_{103}>I_{104}$ and thus, the output terminal is charged by the differential current to make the potential higher. Conversely, when the first input signal is Lo and the second input signal is Hi, the potential of the output terminal is made lower. Therefore, the pulse as illustrated in FIG. 2C is obtained at the output terminal. Thereafter, by providing a buffer and the like at a subsequent stage to the output terminal, the pulse having the amplitude of GND-VDD2 as illustrated in FIG. 2D is obtained.

With regard to the input signal of this embodiment, a signal obtained by inverting the first input signal is the second input signal. However, the relationship between the first and second input signals is not limited thereto. As illustrated in FIG. 2B, what is important is that, at the timing of the first input signal, the relationship of which is higher than which is satisfied with regard to the potentials applied to the gate electrodes of the n-type TFTs 103 and 104.

Further, though the specific exemplary current mirror circuit 150 and differential circuit 160 are described for the purpose of explaining the operation, the circuit structure thereof is not limited to the specific structures illustrated and described herein.

Embodiments of the present invention are now described in the following.

Embodiment 1

Figure 3:
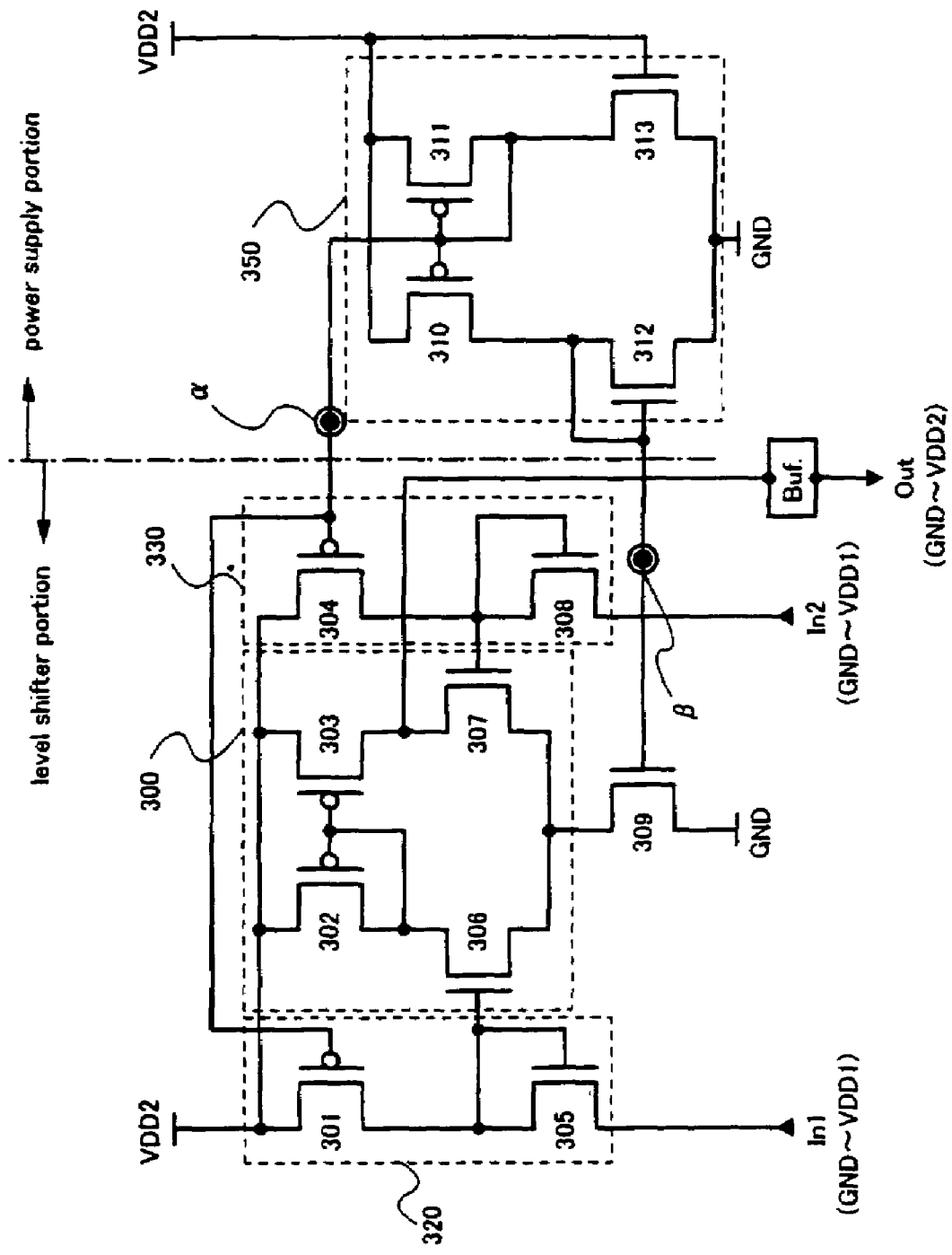
FIG. 3 is a circuit diagram of a level shifter having two input terminals and one output terminal of Embodiment 1 according to the present invention.

FIG. 3 illustrates an embodiment of a level shifter according to the present invention. GND (=0 V), VDD1 (=3 V), and VDD2 (=10 V) are used as power supply potentials in a simulation involved in the description of this embodiment.

The level shifter of this embodiment is composed of a level shifter portion having a differential amplifier circuit surrounded by a broken line frame 300, a first source follower circuit surrounded by a broken line frame 320, and a second source follower circuit surrounded by a broken line frame 330, and a power supply portion surrounded by a broken line frame 350.

First, the structure of the power supply portion is described. A source region of a p-type TFT 310, a source region of a p-type TFT 311, and a gate electrode of an n-type TFT 313 are electrically connected to a power supply VDD2. A source region of an n-type TFT 312 and a source region of the n-type TFT 313 are electrically connected to a power supply GND. A drain region of the n-type TFT 313 is electrically connected to a drain region of the p-type TFT 311, and further, is electrically connected to a gate electrode of the p-type TFT 310 and a gate electrode of the p-type TFT 311 to be input to the level shifter portion at a node represented as α. A drain region of the n-type TFT 312 is electrically connected to a drain region of the p-type TFT 310 and a gate electrode of the n-type TFT 312 to be input to the level shifter portion at a node represented as β.

Next, the structure of the level shifter portion is described. In the differential amplifier circuit 300, a source region of a p-type TFT 302 and a source region of a p-type TFT 303 are electrically connected to the power supply VDD2. A gate electrode of the p-type TFT 302 and a gate electrode of the p-type TFT 303 are electrically connected to each other, and are electrically connected to a drain region of the p-type TFT 302 and a drain region of an n-type TFT 306. A drain region of the p-type TFT 303 is electrically connected to a drain region of an n-type TFT 307 at a node, from which output (Out) is obtained through a buffer (Buf.) and the like. A source region of the n-type TFT 306 and a source region of the n-type TFT 307 are electrically connected to a drain region of an n-type TFT 309. A source region of the n-type TFT 309 is electrically connected to the power supply GND. The potential at the node β is input to a gate electrode of the n-type TFT 309.

In the first source follower circuit 320, a source region of a p-type TFT 301 is electrically connected to the power supply VDD2. The potential at the node α is input to a gate electrode of the p-type TFT 301. On the other hand, a first input signal (In1) is input from a source region of an n-type TFT 305. A drain region of the n-type TFT 305 and a gate electrode of the n-type TFT 305 are electrically connected to each other, and are, further, electrically connected to a drain region of the p-type TFT 301 at a node, the potential at which is input to a gate electrode of the n-type TFT 306 in the differential amplifier circuit 300.

In the second source follower circuit 330, a source region of a p-type TFT 304 is electrically connected to the power supply VDD2. The potential at the node α is input to a gate electrode of the p-type TFT 304. On the other hand, the first input signal (In1) is input from a source region of an n-type TFT 308. A drain region of the n-type TFT 308 and a gate electrode of the n-type TFT 308 are electrically connected to each other, and are, further, electrically connected to a drain region of the p-type TFT 304 at a node, the potential at which is input to a gate electrode of the n-type TFT 307 in the differential amplifier circuit 300.

Operation of the level shifter according to the present invention is now described with reference to FIG. 3 and FIGS. 4A to 4D. FIGS. 4A to 4D illustrate the result of a simulation with regard to the circuit illustrated in FIG. 3.

First, operation of the power supply portion is described. VDD2 is input to the gate electrode of the n-type TFT 313 to make the n-type TFT 313 conductive. This inputs GND to the gate electrode of the p-type TFT 310 and to the gate electrode of the p-type TFT 311 to make both of the p-type TFTs 310 and 311 conductive. Since the p-type TFT 310 is conductive, VDD2 is input to the gate electrode of the n-type TFT 312 to make conductive the n-type TFT 312 conductive. In FIG. 3, the potential which appears at the node α is a little higher than GND, while the potential which appears at the node β is a little lower than VDD2. For the sake of description, the former potential is hereinafter referred to as GND' while the latter potential is hereinafter referred to as VDD2'. (The simulation resulted in GND'=1.8 V and VDD2'=6.8 V:)

Next, operation of the level shifter portion is described. VDD2' outputted from the above-described power supply portion is input to the gate electrode of the n-type TFT 309 to make the n-type TFT 309 conductive. Therefore, the power supply GND is input to the source region of the n-type TFT 306 and to the source region of the n-type TFT 307. On the other hand, GND' outputted from the above-described power supply portion is input to the gate electrode of the p-type TFT 301 and to the gate electrode of the p-type TFT 304 to make both of the p-type TFTs 301 and 304 conductive. Since the gate electrode of the n-type TFT 305 and the drain region of the n-type TFT 305 are connected to each other and the gate electrode of the n-type TFT 308 and the drain region of the n-type TFT 308 are connected to each other, both of the two TFTs 305 and 308 operate in a saturated region. Therefore, the potential obtained by dividing the voltage between VDD2 and the first input signal (In1) by the resistances of the p-type TFT 301 and of the n-type TFT 305 is input to the gate electrode of the n-type TFT 306. This potential is represented as $V_{306}$. Similarly, the potential obtained by dividing the voltage between VDD2 and the second input signal (In2) by the resistances of the p-type TFT 304 and of the n-type TFT 308 is input to the gate electrode of the n-type TFT 307. This potential is represented as $V_{307}$.

Figure 4A:
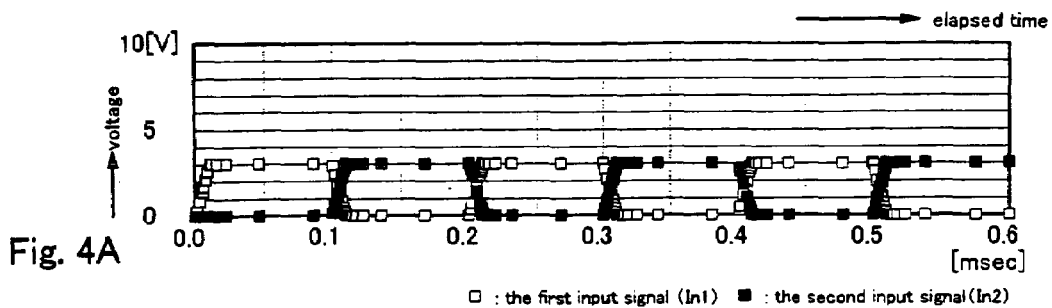
FIGS. 4A to 4D illustrate the result of a simulation of potentials when the level shifter illustrated in FIG. 3 is driven.
Figure 4B:
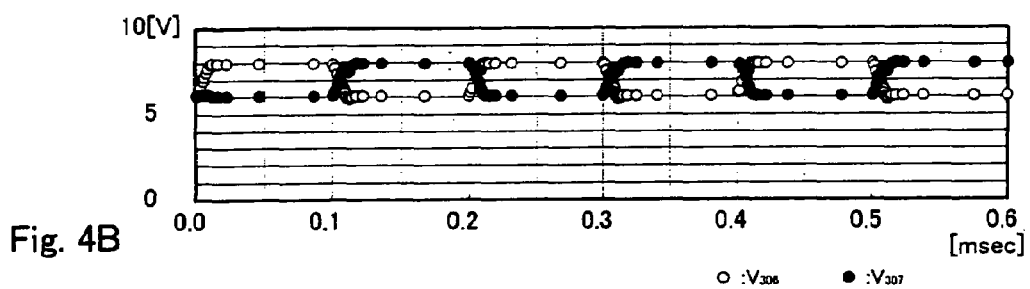
Figure 4C:
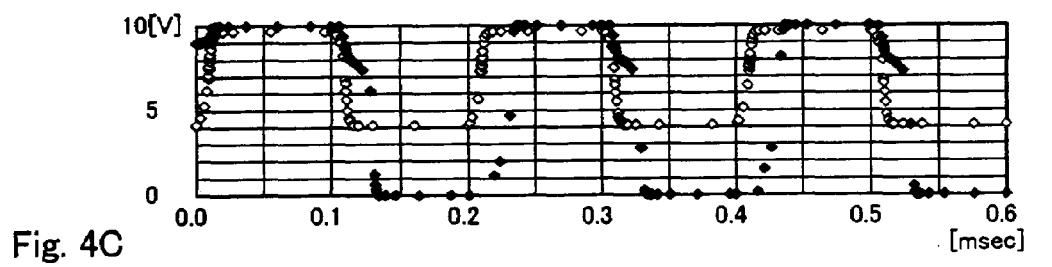

The potentials of $V_{306}$ and $V_{307}$ are as illustrated in FIG. 4B. The differential amplifier circuit surrounded by the broken line frame 300 has a function to amplify and outputting the potential difference between $V_{306}$ and $V_{307}$. Therefore, the pulse as illustrated in FIG. 4C is obtained at the output terminal (Out). Thereafter, by providing a buffer and the like at a subsequent stage to the output terminal, the pulse having the amplitude of GND-VDD2 as illustrated in FIG. 4D is obtained.

Figure 4D:
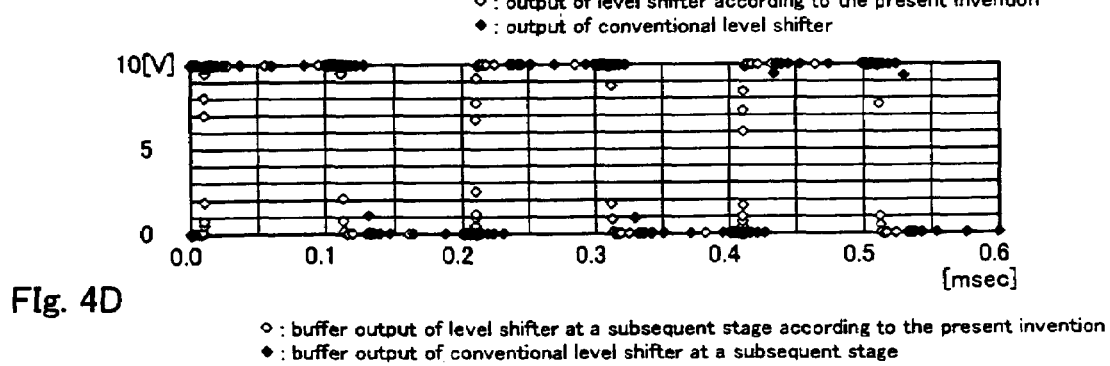

For the sake of comparison, FIGS. 4C and 4D illustrate the result of a simulation of amplitude conversion carried out by conventional level shifters. It can be seen that the output of the level shifter illustrated in FIG. 4C no longer maintains a normal waveform. With regard to the buffer output illustrated in FIG. 4D, though the voltage amplitude of 0-10 V is accomplished, compared with the output of the level shifter according to the present invention, it can be seen that the output of the conventional level shifter illustrated in FIG. 4D greatly delays with respect to the input signal. As described above, the level shifter according to the present invention can carry out normal amplitude conversion which is difficult with the conventional level shifter.

Though, in FIG. 3 according to this embodiment, the TFTs 305 and 308 are n-type TFTs, it may be that the TFTs 305 and 308 are p-type TFTs, the gate electrodes and the drain regions of the TFTs 305 and 308 are connected to the input terminal (In1 or In2), and the source regions of the TFTs 305 and 308 are connected to the drain regions of the TFTs 301 and 304 and to the input portion of the differential circuit.

Embodiment 2

In Embodiment 1, the amplitude of a signal is converted by fixing the lower voltage side (GND) and converting the higher voltage side from VDD1 to VDD2. In this embodiment, a level shifter structured to convert the amplitude of a signal by fixing the higher voltage side and converting the lower voltage side is described. Here, GND, VDD3, and VDD4 are used as the power potentials in the description wherein VDD4<VDD3<GND. GND (=0 V), VDD3 (=−3 V), and VDD4 (=−10 V) are used as the power supply potentials in a simulation involved in the description of this embodiment.

Figure 5:
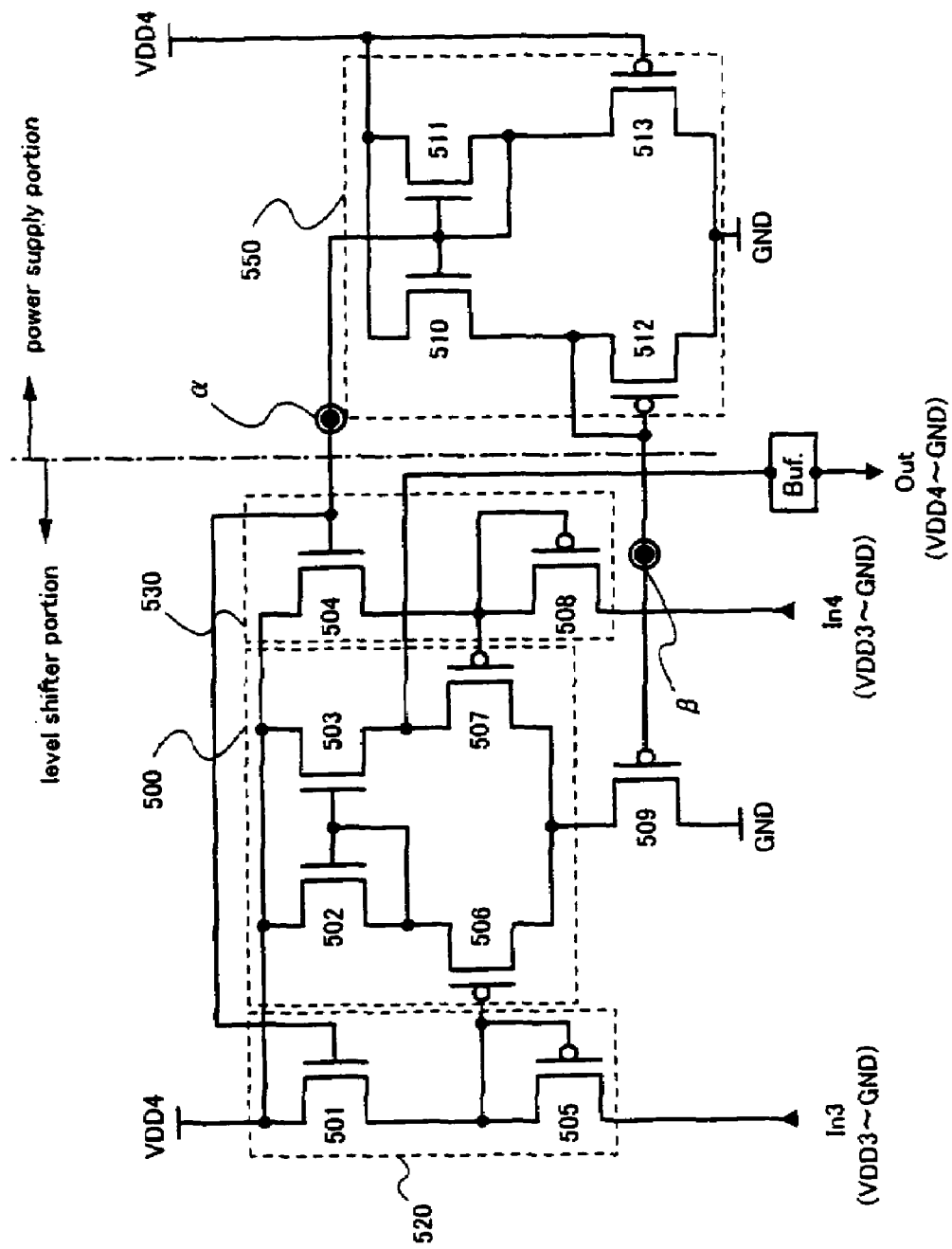
FIG. 5 is a circuit diagram of a level shifter having two input terminals and one output terminal of Example 2 according to the present invention.

FIG. 5 illustrates the structure of a circuit of the level shifter of the present embodiment. The polarities of the TFTs forming the level shifter of the present embodiment are opposite to those of the TFTs forming the level shifter illustrated in FIG. 3. In the present embodiment, a power supply VDD4 is connected at the place where the power supply VDD2 is connected in FIG. 3. This level shifter converts an input signal having the voltage amplitude of VDD3-GND into an output signal having the voltage amplitude of VDD4-GND.

Operation of the level shifter according to the present invention is now described with reference to FIGS. 5 and 6. FIG. 6 illustrates the result of a simulation with regard to the circuit illustrated in FIG. 5. In FIG. 5, a power supply portion surrounded by a broken line frame 550, and a level shifter portion having a differential amplifier circuit 500 and source follower circuits 520 and 530 are respectively described.

First, the power supply portion is described. VDD4 is input to a gate electrode of a p-type TFT 513 to make the p-type TFT 513 conductive. Thus, GND is input to a gate electrode of an n-type TFT 510 and to a gate electrode of an n-type TFT 511 to make both of the n-type TFTs 510 and 511 conductive. Since the n-type TFT 510 is conductive, VDD4 is input to a gate electrode of a p-type TFT 512 to make the p-type TFT 512 conductive. In FIG. 5, the potential which appears at a node α is a little lower than GND, while the potential which appears at a node β is a little higher than VDD4. For the sake of description, the former potential is hereinafter referred to as GND" while the latter potential is hereinafter referred to as VDD4'. (The simulation resulted in GND"=−3.6 V and VDD4'=−8.1 V.)

Next, the level shifter portion is described. First, a third signal and a fourth signal are input from In3 and In4, respectively, in FIG. 5. Meanwhile, VDD4' outputted from the above-described power supply portion is input to a gate electrode of a p-type TFT 509 to make the p-type TFT 509 conductive. Therefore, the power supply GND is input to a source region of a p-type TFT 506 and to a source region of a p-type TFT 507. On the other hand, GND" outputted from the above-described power supply portion is input to a gate electrode of an n-type TFT 501 and to a gate electrode of an n-type TFT 504 to make both of the n-type TFTs 501 and 504 conductive. Since a gate electrode and a drain region of a p-type TFT 505 are connected to each other and a gate electrode and a drain region of a p-type TFT 508 are connected to each other, both of the two TFTs 505 and 508 operate in a saturated region. Therefore, the potential obtained by dividing the voltage between VDD4 and the third input signal (In3) by the resistances of the n-type TFT 501 and of the p-type TFT 505 is input to a gate electrode of the p-type TFT 506. This potential is represented as $V_{506}$. Similarly, the potential obtained by dividing the voltage between VDD4 and the fourth input terminal (In4) by the resistances of the n-type TFT 504 and of the p-type TFT 508 is input to a gate electrode of the p-type TFT 507. This potential is represented as $V_{507}$.

Figure 6A:
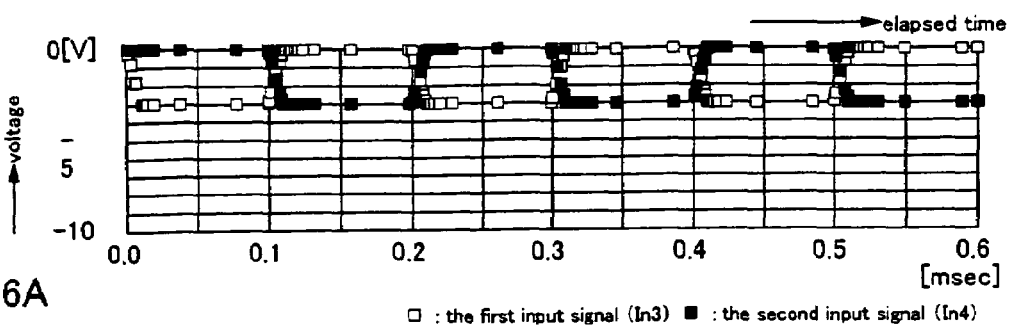
FIGS. 6A to 6D illustrate the result of a simulation of potentials when the level shifter illustrated in FIG. 5 is driven.
Figure 6B:
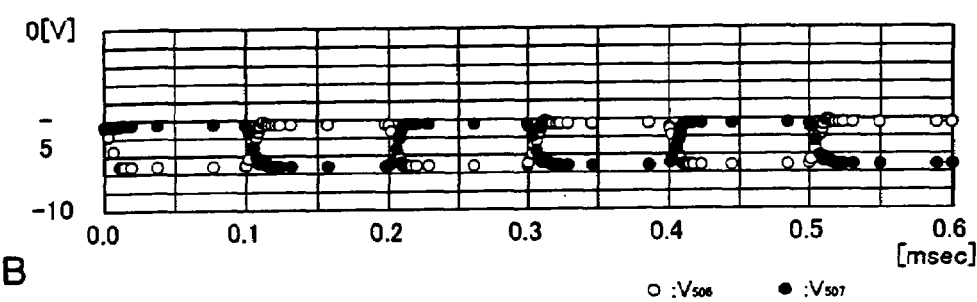
Figure 6C:
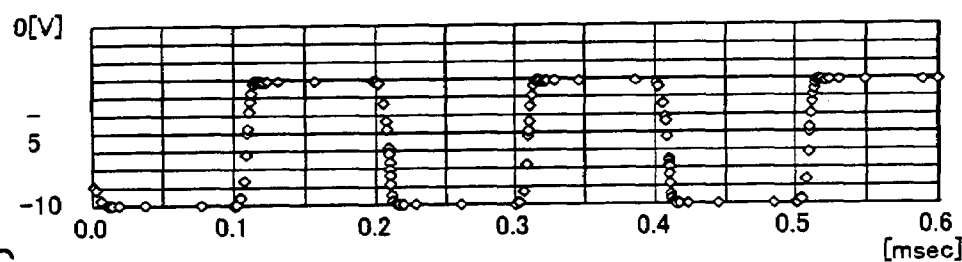
Figure 6D:
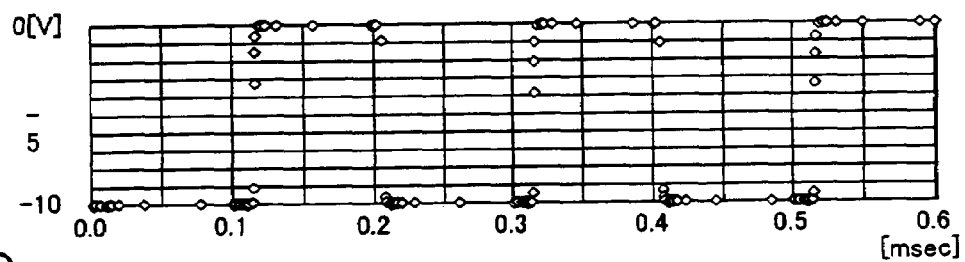

The potentials of $V_{506}$ and $V_{507}$ are as illustrated in FIG. 6B. The differential amplifier circuit surrounded by the broken line frame 500 has a function to amplify and output the potential difference between $V_{506}$ and $V_{507}$. Therefore, the pulse as illustrated in FIG. 6C is obtained at an output terminal (Out). Thereafter, by providing a buffer and the like at a subsequent stage to the output terminal, the pulse having the amplitude of GND-VDD4 as illustrated in FIG. 6D is obtained.

Though, in FIG. 5 according to this embodiment, the TFTs 505 and 508 are p-type TFTs, it may be that the TFTs 505 and 508 are n-type TFTs, the gate electrodes and the drain regions of the TFTs 505 and 508 are connected to the input terminal (In3 or In4), and source regions of the TFTs 505 and 508 are connected to drain regions of the TFTs 501 and 504 and to an input portion of a differential circuit.

Embodiment 3

Though each of the level shifters according to the present invention described in Examples 1 and 2 has two input terminals and one output terminal, a level shifter may have one input terminal and one output terminal while using a similar circuit. In this embodiment, a level shifter having one input terminal and one output terminal for converting a signal having the voltage amplitude of GND-VDD1 into a signal having the voltage amplitude of GND-VDD2 is described by way of example.

Figure 7:
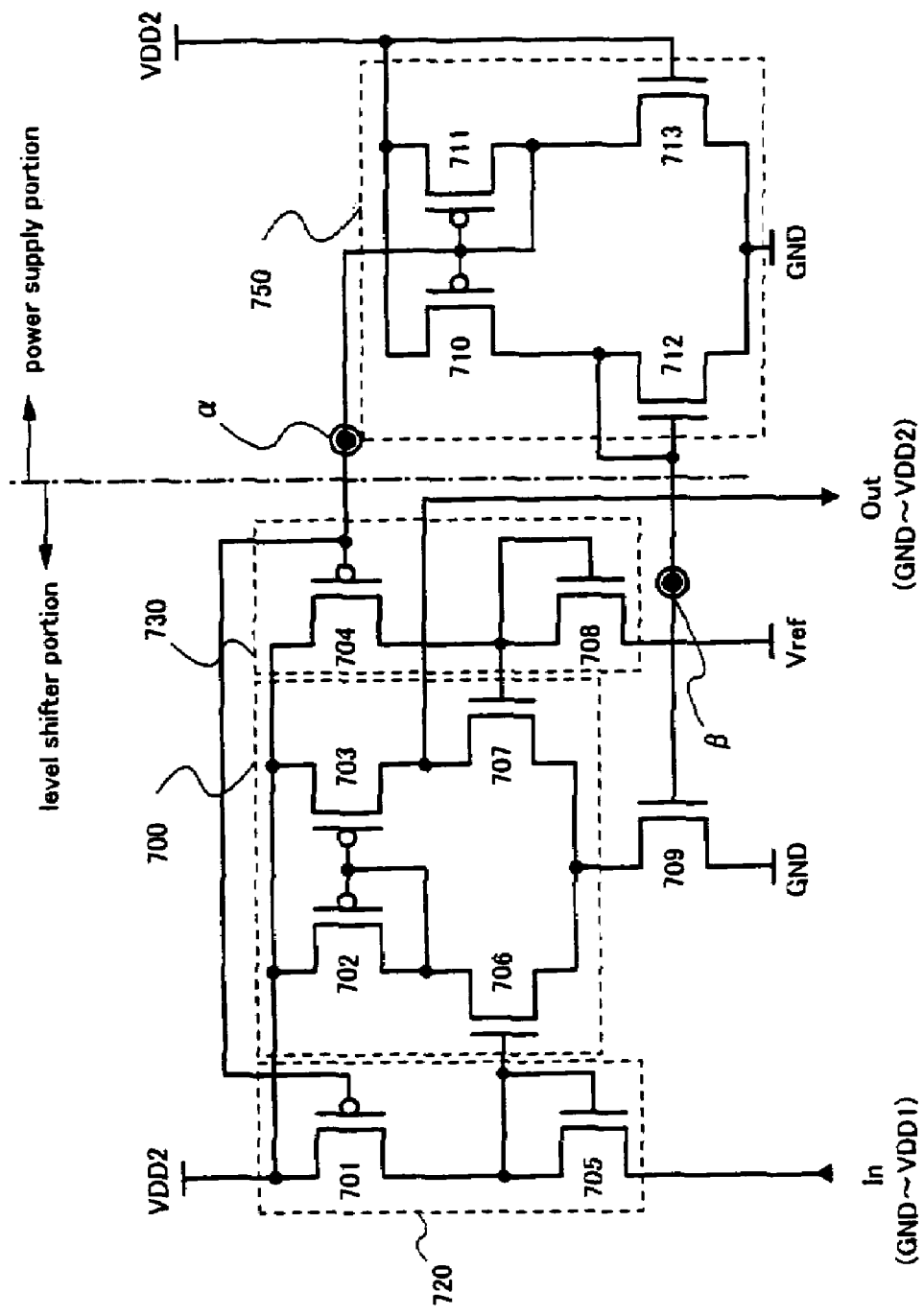
FIG. 7 is a circuit diagram of a level shifter having one input terminal and one output terminal of Embodiment 3 according to the present invention.

FIG. 7 shows an exemplary level shifter having one input terminal and one output terminal. There is no difference in the circuit structure between the level shifter of this embodiment and the level shifter of Embodiment 1 except that the terminal to which the second signal (In2) is input in Embodiment 1 is connected to a power supply Vref in this embodiment. Here, GND (=0 V), VDD1 (=3 V), VDD2 (=10 V), and Vref (=1.5 V) are used as the power supply potentials. It is preferable that the potential of Vref is in the range of the amplitude of the input signal (In). In this example, the potential of Vref is set to be in the middle between GND (=0 V) and VDD1 (=3 V), for example.

Operation of the level shifter according to the present invention is now described with reference to FIG. 7 and FIGS. 8A to 8D. FIGS. 8A to 8D illustrate the result of a simulation with regard to the circuit illustrated in FIG. 7. In FIG. 7, a power supply portion surrounded by a broken line frame 750, and a level shifter portion having a differential amplifier circuit 700 and source follower circuits 720 and 730 are respectively described.

First, operation of the power supply portion is described. VDD2 (=10 V) is input to a gate electrode of an n-type TFT 713 to make the n-type TFT 713 conductive. Thus, GND (=0 V) is input to a gate electrode of a p-type TFT 710 and to a gate electrode of a p-type TFT 711 to make both of the p-type TFTs 710 and 711 conductive. Since the p-type TFT 710 is conductive, VDD2 (=10 V) is input to a gate electrode of an n-type TFT 712 to make the n-type TFT 712 conductive. Therefore, in FIG. 5, the potential which appears at a node α is a little higher than GND, while the potential which appears at a node β is a little lower than VDD2. For the sake of description, the former potential is hereinafter referred to as GND' while the latter potential is hereinafter referred to as VDD2'. (The simulation resulted in GND'=1.8 V and VDD2'=6.8 V.)

Next, operation of the level shifter portion is described. VDD2' outputted from the above-described power supply portion is input to a gate electrode of an n-type TFT 709 to make the n-type TFT 709 conductive. Therefore, a source region of an n-type TFT 706 and a source region of an n-type TFT 707 are electrically connected to the power supply GND. On the other hand, GND' outputted from the above-described power supply portion is input to a gate electrode of a p-type TFT 701 and to a gate electrode of a p-type TFT 704 to make both of the p-type TFTs 701 and 704 conductive. Since a gate electrode and a drain region of an n-type TFT 705 are connected to each other and a gate electrode of an n-type TFT 708 and a drain region of an n-type TFT 708 are connected to each other, both of the two TFTs 705 and 708 operate in a saturated region. Therefore, the potential obtained by dividing the voltage between VDD2 and the first input signal (In) by the resistances of the p-type TFT 701 and of the n-type TFT 705 is input to a gate electrode of the n-type TFT 706. This potential is represented as $V_{706}$. Similarly, the potential obtained by dividing the voltage between VDD2 and the second input signal (Inb) by the resistances of the p-type TFT 704 and of the n-type TFT 708 is input to a gate electrode of the n-type TFT 707. This potential is represented as $V_{707}$.

Figure 8A:
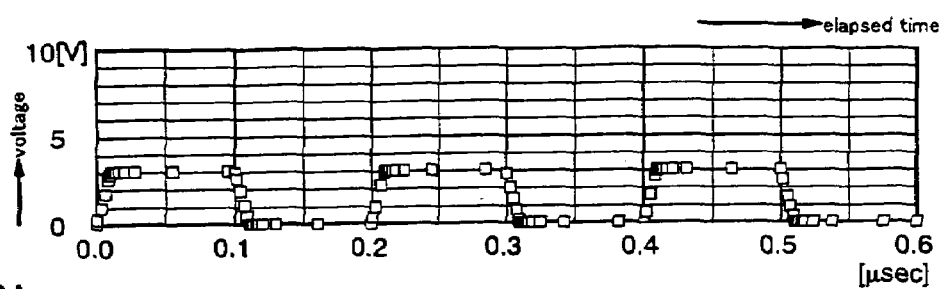
FIGS. 8A to 8D illustrate the result of a simulation of potentials when the level shifter illustrated in FIG. 7 is driven.
Figure 8B:
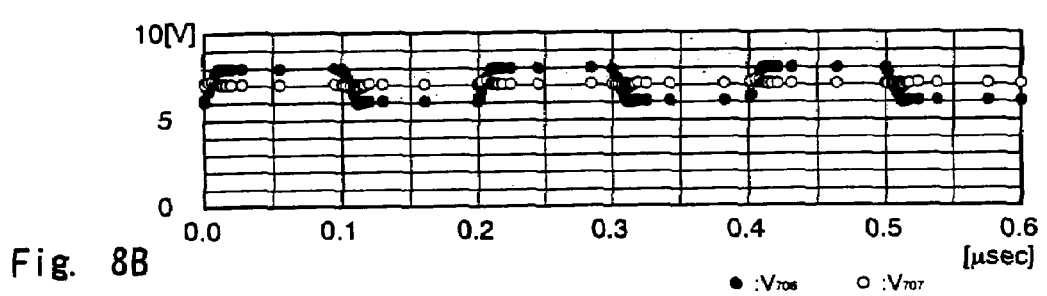

Here, the relationship between $V_{706}$ and $V_{707}$ is examined. First, since the voltage between VDD2 (=10 V) and Vref (=1.5 V) is constant, $V_{707}$ is also a constant potential. On the other hand, as illustrated in FIGS. 8A and 8B, $V_{706}$ when the potential of the input signal (In) is Hi (=3 V) and $V_{706}$ when the potential of the input signal (In) is Lo (=0 V) are different from each other. In the following, the relationship between $V_{706}$ and $V_{707}$ is described with regard to the above two cases.

(1) When Hi is input as the input signal (In)

In this case, $V_{706}$ is the potential obtained by dividing the voltage between VDD2(=10 V) and VDD1 (=3 V) by the resistances of the p-type TFT 701 and of the n-type TFT 705. Since GND (=0 V)<Vref (=1.5 V)<VDD1 (=3 V), it follows that $V_{706}>V_{707}$ (FIG. 8B).

(2) When Lo is input as the input signal (In)

In this case, $V_{706}$ is the potential obtained by dividing the voltage between VDD2(=10 V) and GND (=0 V) by the resistances of the p-type TFT 701 and of the n-type TFT 705. Similarly to the case of the above (1), since GND (=0 V)<Vref (=1.5 V)<VDD1 (=3 V), it follows that $V_{706}<V_{707}$ (FIG. 8B).

Figure 8C:
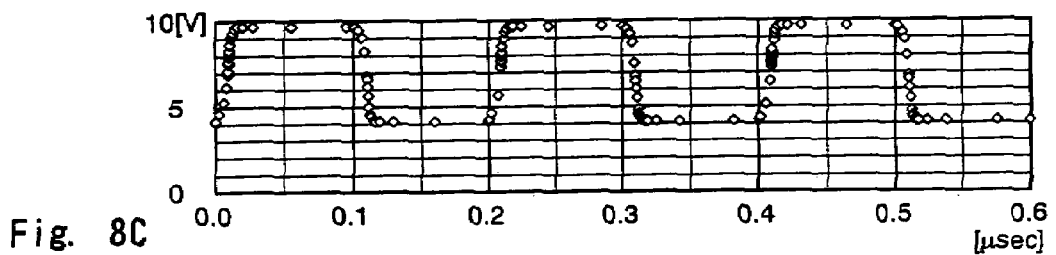
Figure 8D:
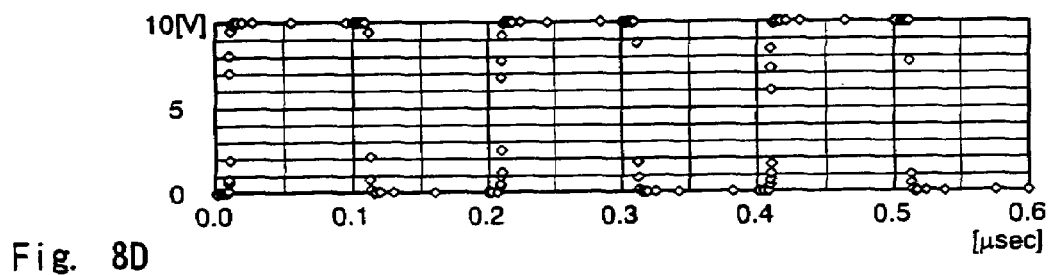

Therefore, the pulse as illustrated in FIG. 8C is obtained at the output terminal (Out). Thereafter, by providing a buffer and the like at a subsequent stage to the output terminal, the pulse having the amplitude of GND-VDD2 as illustrated in FIG. 8D is obtained.

Though, in FIG. 7 according to this embodiment, the TFTs 705 and 708 are n-type TFTs, it may be that the TFTs 705 and 708 are p-type TFTs, the gate electrodes and the drain regions of the TFTs 705 and 708 are connected to the input terminal (In) or Vref, and source regions of the TFTs 705 and 708 are connected to drain regions of the TFTs 701 and 704 and to an input portion of a differential circuit.

Embodiment 4

In Embodiment 4, a method of simultaneously manufacturing TFTs of driver circuit portions provided in the pixel portion and the periphery thereof (a source signal line driver circuit and a gate signal line driver circuit). However, in order to simplify the explanation, a CMOS circuit, which is the basic circuit for the driver circuit, is shown in the figures.

First, as shown in FIG. 9A, a base film 5002 made of an insulating film such as a silicon oxide film, a silicon nitride film, or a silicon oxynitride film is formed on a substrate 5001 made of glass such as barium borosilicate glass or alumino borosilicate glass, typified by #7059 glass or #1737 glass of Corning Inc. For example, a silicon oxynitride film 5002a fabricated from $SiH_4$, $NH_3$ and $N_2O$ by a plasma CVD method is formed with a thickness of 10 to 200 nm (preferably 50 to 100 nm), and a hydrogenated silicon oxynitride film 5002b similarly fabricated from $SiH_4$ and $N_2O$ is formed with a thickness of 50 to 200 nm (preferably 100 to 150 nm) to form a lamination. In Embodiment 4, although the base film 5002 is shown as the two-layer structure, the film may be formed of a single layer film of the foregoing insulating film or as a lamination structure of more than two layers.

Island-like semiconductor films 5003 to 5006 are formed of a crystalline semiconductor film manufactured by using a laser crystallization method on a semiconductor film having an amorphous structure, or by using a known thermal crystallization method. The thickness of the island-like semiconductor films 5003 to 5006 is set from 25 to 80 nm (preferably between 30 and 60 nm). There is no limitation on the crystalline semiconductor film material, but it is preferable to form the film from a silicon or a silicon germanium (SiGe) alloy.

A laser such as a pulse oscillation type or continuous emission type excimer laser a YAG laser, or a $YVO_4$ laser is used for manufacturing the crystalline semiconductor film in the laser crystallization method. A method of condensing laser light emitted from a laser oscillator into a linear shape by an optical system and then irradiating the light to the semiconductor film may be employed when these types of lasers are used. The crystallization conditions may be suitably selected by the operator, but the pulse oscillation frequency is set to 30 Hz, and the laser energy density is set from 100 to 400 $mJ/cm^2$ (typically between 200 and 300 $mJ/cm^2$) when using the excimer laser. Further, the second harmonic is utilized when using the YAG laser, the pulse oscillation frequency is set from 1 to 10 kHz, and the laser energy density may be set from 300 to 600 $mJ/cm^2$ (typically between 350 and 500 $mJ/cm^2$). The laser light which has been condensed into a linear shape with a width of 100 to 1000 µm, for example 400 µm, is then irradiated over the entire surface of the substrate. This is performed with an overlap ratio of 80 to 98%.

Next, a gate insulating film 5007 is formed covering the island-like semiconductor films 5003 to 5006. The gate insulating film 5007 is formed of an insulating film containing silicon with a thickness of 40 to 150 nm by a plasma CVD method or a sputtering method. A 120 nm thick silicon oxynitride film is formed in Embodiment 4. The gate insulating film is not limited to such a silicon oxynitride film, of course, and other insulating films containing silicon may also be used, in a single layer or in a lamination structure. For example, when using a silicon oxide film, it can be formed by the plasma CVD method with a mixture of TEOS (tetraethyl orthosilicate) and $O_2$, at a reaction pressure of 40 Pa, with the substrate temperature set from 300 to 400° C., and by discharging at a high frequency (13.56 MHz) with electric power density of 0.5 to 0.8 $W/cm^2$. Good characteristics of the silicon oxide film thus manufactured as a gate insulating film can be obtained by subsequently performing thermal annealing at 400 to 500° C.

A first conductive film 5008 and a second conductive film 5009 are then formed on the gate insulating film 5007 in order to form gate electrodes. In Embodiment 4, the first conductive film 5008 is formed from Ta with a thickness of 50 to 100 nm, and the second conductive film 5009 is formed from W with a thickness of 100 to 300 nm.

The Ta film is formed by sputtering, and sputtering of a Ta target is performed by using Ar. If an appropriate amount of Xe or Kr is added to the Ar during sputtering, the internal stress of the Ta film will be relaxed, and film peeling can be prevented. The resistivity of an α phase Ta film is on the order of 20 µΩcm, and the Ta film can be used for the gate electrode, but the resistivity of a β phase Ta film is on the order of 180 µΩcm and the Ta film is unsuitable for the gate electrode. The α phase Ta film can easily be obtained if a tantalum nitride film, which possesses a crystal structure near that of α phase Ta, is formed with a thickness of 10 to 50 nm as a base for Ta in order to form the α phase Ta film.

The W film is formed by sputtering with W as a target. The W film can also be formed by a thermal CVD method using tungsten hexafluoride ($WF_6$). Whichever is used, it is necessary to make the film low resistant in order to use it as the gate electrode, and it is preferable that the resistivity of the W film be set 20 µΩcm or less. The resistivity can be lowered by enlarging the crystals of the W film, but for cases where there are many impurity elements such as oxygen within the W film, crystallization is inhibited, and the film becomes high resistant. A W target having a purity of 99.9999% or 99.99% is thus used in sputtering. In addition, by forming the W film while taking sufficient care such that no impurities from the inside of the gas phase are introduced at the time of film formation, a resistivity of 9 to 20 μΩcm can be achieved.

Note that although the first conductive film 5008 and the second conductive film 5009 are formed from Ta and W, respectively, in Embodiment 4, the conductive films are not limited to these. Both the first conductive film 5008 and the second conductive film 5009 may also be formed from an element selected from the group consisting of Ta, W, Ti, Mo, Al, and Cu, or from an alloy material or a chemical compound material having one of these elements as its main constituent. Further, a semiconductor film, typically a polysilicon film, into which an impurity element such as phosphorous is doped, may also be used. Examples of preferable combinations other than that in Embodiment 4 include: the first conductive film 5008 formed from tantalum nitride (TaN) and the second conductive film 5009 formed from W; the first conductive film 5008 formed from tantalum nitride (TaN) and the second conductive film 5009 formed from Al; and the first conductive film 5008 formed from tantalum nitride (TaN) and the second conductive film 5009 formed from Cu.

Next, a mask 5010 is formed from resist, and a first etching process is performed in order to form electrodes and wirings. An ICP (inductively coupled plasma) etching method is used in Embodiment 4. A gas mixture of $CF_4$ and $Cl_2$ is used as an etching gas and a plasma is generated by applying a 500 W RF electric power (13.56 MHz) to a coil shape electrode at 1 Pa. A 100 W RF electric power (13.56 MHz) is also applied to the substrate side (test piece stage), effectively applying a negative self-bias voltage. The W film and the Ta film are both etched on the same order when $CF_4$ and $Cl_2$ are mixed.

Edge portions of the first conductive layer and the second conductive layer are made into a tapered shape in accordance with the effect of the bias voltage applied to the substrate side with the above etching conditions by using a suitable resist mask shape. The angle of the tapered portions is from 15 to 45°. The etching time may be increased by approximately 10 to 20% in order to perform etching without any residue on the gate insulating film. The selectivity of a silicon oxynitride film with respect to a W film is from 2 to 4 (typically 3), and therefore approximately 20 to 50 nm of the exposed surface of the silicon oxynitride film is etched by this over-etching process. First shape conductive layers 5011 to 5016 (first conductive layers 5011a to 5016a and second conductive layers 5011b to 5016b) are thus formed of the first conductive layer and the second conductive layer by the first etching process. At this point, regions of the gate insulating film 5007 not covered by the first shape conductive layers 5011 to 5016 are made thinner by approximately 20 to 50 nm by etching. (FIG. 9A)

Then, a first doping process is performed to add an impurity element for imparting a n-type conductivity. Doping may be carried out by an ion doping method or an ion injecting method. The condition of the ion doping method is that a dosage is $1\times10^{13}$ to $5\times10^{14}$ atoms/cm², and an acceleration voltage is 60 to 100 keV. As the impurity element for imparting the n-type conductivity, an element belonging to group 15, typically phosphorus (P) or arsenic (As) is used, but phosphorus is used here. In this case, the conductive layers 5011 to 5016 become masks to the impurity element to impart the n-type conductivity, and first impurity regions 5017 to 5020 are formed in a self-aligning manner. The impurity element to impart the n-type conductivity in the concentration range of $1\times10^{20}$ to $1\times10^{21}$ atoms/cm³ is added to the first impurity regions 5017 to 5020. (FIG. 9B)

Next, as shown in FIG. 9C, a second etching process is performed without removing the resist mask. The etching gas of the mixture of $CF_4$, $Cl_2$ and $O_2$ is used, and the W film is selectively etched. At this point, second shape conductive layers 5021 to 5026 (first conductive layers 5021a to 5026a and second conductive layers 5021b to 5026b) are formed by the second etching process. Regions of the gate insulating film 5007, which are not covered with the second shape conductive layers 5021 to 5026 are made thinner by about 20 to 50 nm by etching.

An etching reaction of the W film or the Ta film by the mixture gas of $CF_4$ and $Cl_2$ can be guessed from a generated radical or ion species and the vapor pressure of a reaction product. When the vapor pressures of fluoride and chloride of W and Ta are compared with each other, the vapor pressure of $WF_6$ of fluoride of W is extremely high, and other $WCl_5$, $TaF_5$, and $TaCl_5$ have almost equal vapor pressures. Thus, in the mixture gas of $CF_4$ and $Cl_2$, both the W film and the Ta film are etched. However, when a suitable amount of $O_2$ is added to this mixture gas, $CF_4$ and $O_2$ react with each other to form CO and F, and a large number of F radicals or F ions are generated. As a result, an etching rate of the W film having the high vapor pressure of fluoride is increased. On the other hand, with respect to Ta, even if F is increased, an increase of the etching rate is relatively small. Besides, since Ta is easily oxidized as compared with W, the surface of Ta is oxidized by addition of $O_2$. Since the oxide of Ta does not react with fluorine or chlorine, the etching rate of the Ta film is further decreased. Accordingly, it becomes possible to make a difference between the etching rates of the W film and the Ta film, and it becomes possible to make the etching rate of the W film higher than that of the Ta film.

Then, as shown in FIG. 10A, a second doping process is performed. In this case, a dosage is made lower than that of the first doping process and under the condition of a high acceleration voltage, an impurity element for imparting the n-type conductivity is doped. For example, the process is carried out with an acceleration voltage set to 70 to 120 keV and at a dosage of $1\times10^{13}$ atoms/cm², so that new impurity regions are formed inside of the first impurity regions formed into the island-like semiconductor layers in FIG. 9B. Doping is carried out such that the second shape conductive layers 5021 to 5026 are used as masks to the impurity element and the impurity element is added also to the regions under the first conductive layers 5021a to 5026a. In this way, second impurity regions 5027 to 5031 are formed. The concentration of phosphorous (P) added to the second impurity regions 5027 to 5031 has a gentle concentration gradient in accordance with the thickness of tapered portions of the first conductive layers 5021a to 5026a. Note that in the semiconductor layer that overlap with the tapered portions of the first conductive layers 5021a to 5026a, the concentration of impurity element slightly falls from the end portions of the tapered portions of the first conductive layers 5021a to 5026a toward the inner portions, but the concentration keeps almost the same level.

As shown in FIG. 10B, a third etching process is performed. This is performed by using a reactive ion etching method (RIE method) with an etching gas of $CHF_6$. The tapered portions of the first conductive layers 5021a to 5026a are partially etched, and the region in which the first conductive layers overlap with the semiconductor layer is reduced by the third etching process. Third shape conductive layers 5032 to 5037 (first conductive layers 5032a to 5037a and second conductive layers 5032b to 5037b) are formed. At this point, regions of the gate insulating film 5007, which are not covered with the third shape conductive layers 5032 to 5037 are made thinner by about 20 to 50 nm by etching.

By the third etching process, in the case of second impurity regions 5027 to 5031, second impurity regions 5027a to 5031a which overlap with the first conductive layers 5032a to 5037a, and third impurity regions 5027b to 5231b between the first impurity regions and the second impurity regions.

Then, as shown in FIG. 10C, fourth impurity regions 5039 to 5044 having a conductivity type opposite to the first conductivity type are formed in the island-like semiconductor layers 5004 forming p-channel TFTs. The third conductive layers 5033b are used as masks to an impurity element, and the impurity regions are formed in a self-aligning manner. At this time, the whole surfaces of the island-like semiconductor layers 5003, 5005, the retention capacitor portion 5006 and the wiring portion 5034, which form n-channel TFTs are covered with a resist mask 5038. Phosphorus is added to the impurity regions 5039 to 5044 at different concentrations, respectively. The regions are formed by an ion doping method using diborane ($B_2H_6$) and the impurity concentration is made $2\times10^{20}$ to $2\times10^{21}$ atoms/$cm^3$ in any of the regions.

By the steps up to this, the impurity regions are formed in the respective island-like semiconductor layers. The third shape conductive layers 5032, 5033, 5035, and 5036 overlapping with the island-like semiconductor layers function as gate electrodes. The numeral 5034 functions as an island-like source signal line. The numeral 5037 functions as a capacitor wiring.

After the resist mask 5038 is removed, a step of activating the impurity elements added in the respective island-like semiconductor layers for the purpose of controlling the conductivity type. This step is carried out by a thermal annealing method using a furnace annealing oven. In addition, a laser annealing method or a rapid thermal annealing method (RTA method) can be applied. The thermal annealing method is performed in a nitrogen atmosphere having an oxygen concentration of 1 ppm or less, preferably 0.1 ppm or less and at 400 to 700° C., typically 500 to 600° C. In Embodiment 4, a heat treatment is conducted at 500° C. for 4 hours. However, in the case where a wiring material used for the third conductive layers 5037 to 5042 is weak to heat, it is preferable that the activation is performed after an interlayer insulating film (containing silicon as its main ingredient) is formed to protect the wiring line or the like.

Further, a heat treatment at 300 to 450° C. for 1 to 12 hours is conducted in an atmosphere containing hydrogen of 3 to 100%, and a step of hydrogenating the island-like semiconductor layers is conducted. This step is a step of terminating dangling bonds in the semiconductor layer by thermally excited hydrogen. As another means for hydrogenation, plasma hydrogenation (using hydrogen excited by plasma) may be carried out.

Next, a first interlayer insulating film 5045 of a silicon oxynitride film is formed with a thickness of 100 to 200 nm. Then, a second interlayer insulating film 5046 of an organic insulating material is formed thereon. After that, etching is carried out to form contact holes.

Figure 11A:
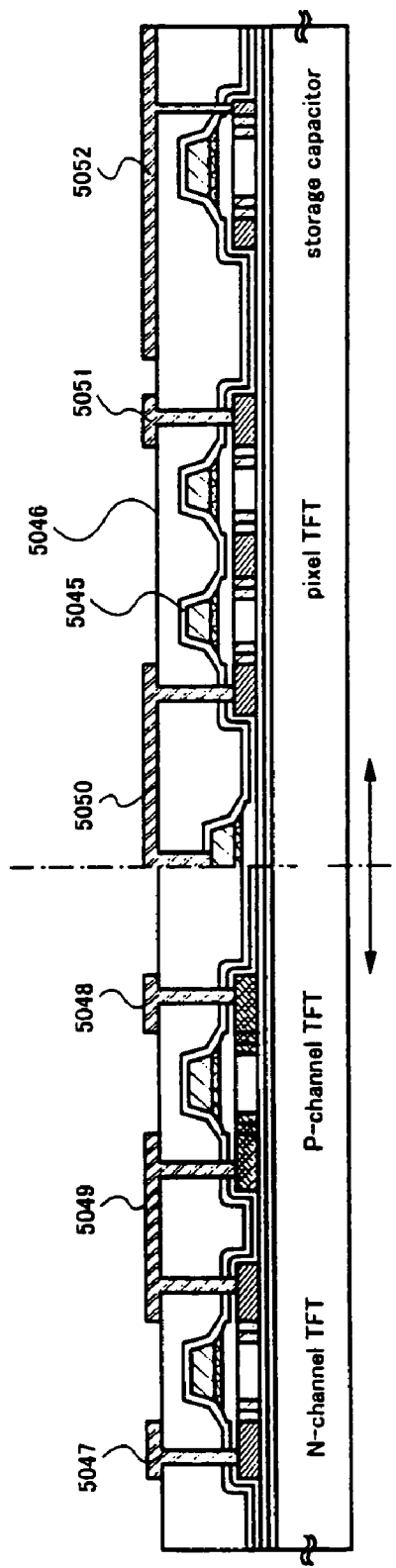
FIGS. 11A to 11B illustrate an exemplary manufacturing process of the active matrix substrate of Example 4 according to the present invention.

Then, in the driver circuit portion, source wirings 5047 and 5048 for contacting the source regions of the island-like semiconductor layers, and a drain wiring 5049 for contacting the drain regions of the island-like semiconductor layers are formed. In the pixel portion, a connecting electrode 5050 and pixel electrodes 5051 and 5052 are formed (FIG. 11A). The connecting electrode 5050 allows electric connection between the source signal line 5034 and pixel TFTs. It is to be noted that the pixel electrode 5052 and a storage capacitor are of an adjacent pixel.

As described above, the driver circuit portion having the n-type TFT and the p-type TFT and the pixel portion having the pixel TFT and the storage capacitor can be formed on one substrate. Such a substrate is herein referred to as an active matrix substrate.

In this embodiment, end portions of the pixel electrodes are arranged so as to overlap signal lines and scanning lines for the purpose of shielding from light spaces between the pixel electrodes without using a black matrix.

Further, according to the process described in the present embodiment, the number of photomasks necessary for manufacturing an active matrix substrate can be set to five (a pattern for the island-like semiconductor layers, a pattern for the first wirings (scanning lines, signal lines, and capacitor wirings), a mask pattern for the p channel regions, a pattern for the contact holes, and a pattern for the second wirings (including the pixel electrodes and the connecting electrodes)). As a result, the process can be made shorter, the manufacturing cost can be lowered, and the yield can be improved.

Next, after the active matrix substrate as illustrated in FIG. 11A is obtained, an orientation film 5053 is formed on the active matrix substrate and a rubbing treatment is carried out.

Meanwhile, an opposing substrate 5054 is prepared. Color filter layers 5055 to 5057 and an overcoat layer 5058 are formed on the opposing substrate 5054. The color filter layers are structured such that the red color filter layer 5055 and the blue color filter layer 5056 overlap over the TFTs so as to serve also as a light-shielding film. Since it is necessary to shield from light at least spaces among the TFTs, the connecting electrodes, and the pixel electrodes, it is preferable that the red color filter and the blue color filter are arranged so as to overlap such that these places are shielded from light.

The red color filter layer 5055, the blue color filter layer 5056, and the green color filter layer 5057 are overlapped so as to align with the connecting electrode 5050 to form a spacer. The respective color filters are formed by mixing appropriate pigments in an acrylic resin and are formed with a thickness of 1 to 3 μm. These color filters can be formed from a photosensitive material in a predetermined pattern using a mask. Taking into consideration the thickness of the overcoat layer 5058 of 1 to 4 μm, the height of the spacer can be made to be 2 to 7 μm, preferably 4 to 6 μm. This height forms a gap when the active matrix substrate and the opposing substrate are adhered to each other. The overcoat layer 5058 is formed of a photosetting or thermosetting organic resin material such as a polyimide resin or an acrylic resin.

Figure 11B:
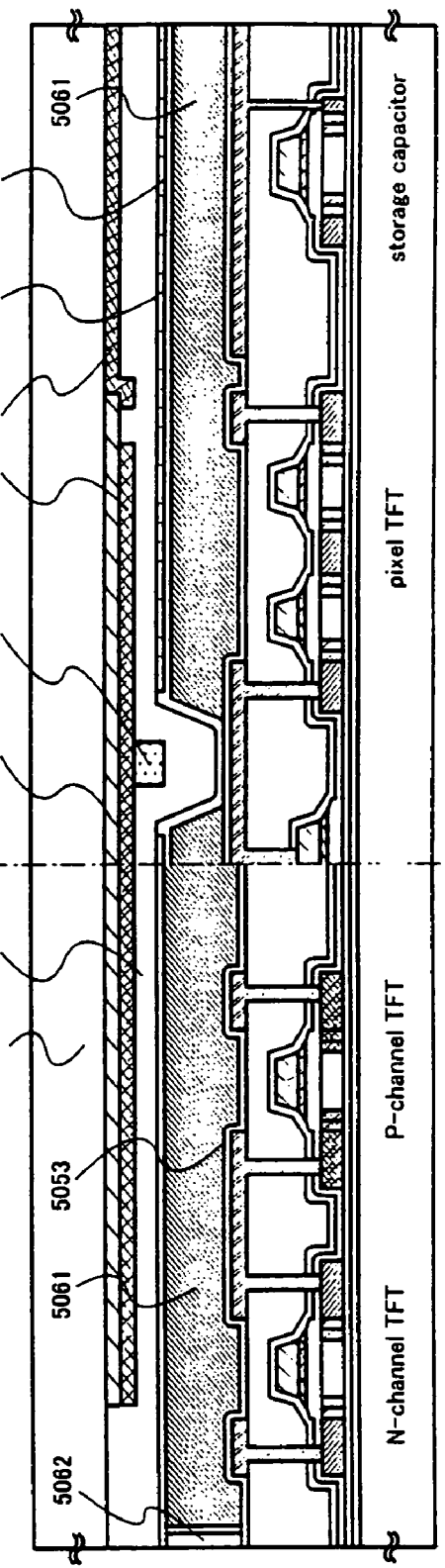
Figure 12A:
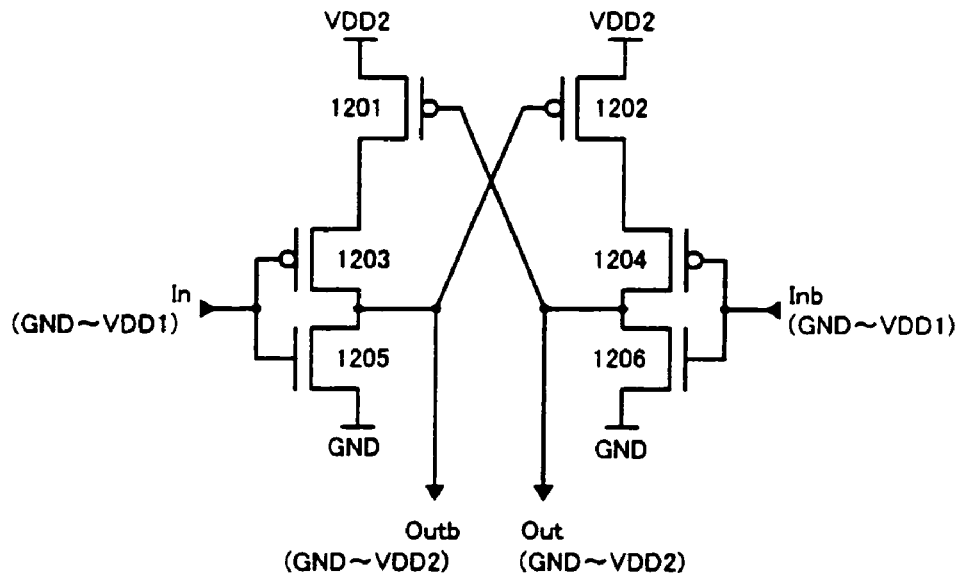
FIGS. 12A and 12B are circuit diagrams of a conventional level shifter having two input terminals and two output terminals.
Figure 12B:
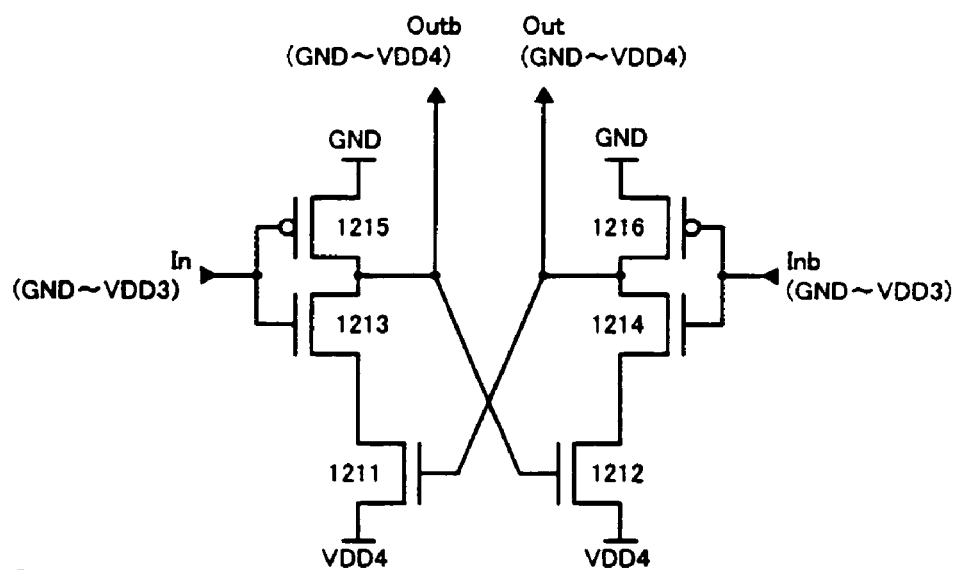

The arrangement of the spacer may be arbitrarily determined. For example, as illustrated in FIG. 11B, the spacer may be arranged on the opposing substrate 5054 so as to align with the connecting electrode 5050. Or, the spacer may be arranged on the opposing substrate 5054 so as to align with a TFT of the driver circuit portion. Such spacers may be arranged over the whole surface of the driver circuit portion, or may be arranged so as to cover the source wirings and the drain wirings.

After the overcoat layer 5058 is formed, an opposing electrode 5059 is patterned to be formed, an orientation film 5060 is formed, and a rubbing treatment is carried out.

Then, the active matrix substrate having the pixel portion and the driver circuit portion formed thereon is adhered to the opposing substrate using a sealant 5062. Filler is mixed in the sealant 5062. The filler and the spacers help the two substrates to be adhered to each other with a constant gap therebetween. After that, a liquid crystal material 5061 is injected between the substrates, and encapsulant (not shown) carries out full encapsulation. As the liquid crystal material 5061, a known liquid crystal material may be used. In this way, an active matrix liquid crystal display device as illustrated in FIG. 11B is completed.

It is to be noted that, though the TFTs formed in the above processes are of a top-gate structure, this embodiment may be easily applied to TFTs of a bottom-gate structure and of other structures.

Further, though the display device illustrated in this embodiment is a liquid crystal display device, the level shifter according to the present invention can be effectively utilized in a driver circuit of an EL display device using electroluminescence (EL) as well as the liquid crystal display device.

Embodiment 5

Figure 16:
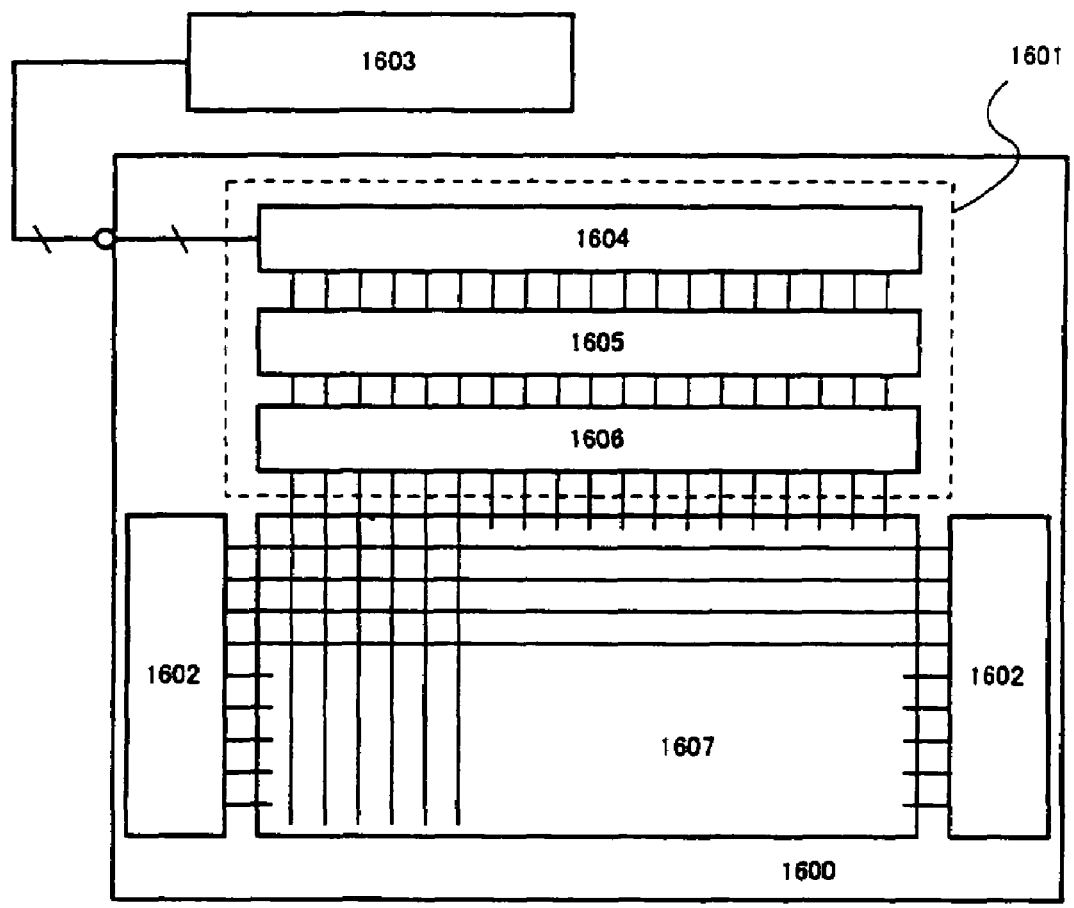
FIG. 16 is a schematic view of a circuit of a display device as a whole formed on one substrate using a level shifter of Example 5 according to the present invention.

FIG. 16 illustrates an exemplary structure of a display device using a level shifter according to the present invention. A source signal line driver circuit 1601, a gate signal line driver circuit 1602, and a pixel portion 1607 are integrally formed on an insulating substrate 1600. The source signal line driver circuit 1601 has a level shifter 1604, a shift register 1605, an analog switch 1606, and the like.

Signals necessary for driving the display device are supplied from an external LSI. Since power consumption of an LSI or the like becomes lower these days and such an LSI operates at voltage as low as 3.3 V, for example, the amplitude of an input signal is converted by the level shifter 1604 according to the present invention to be sent to the shift register and the like.

It is to be noted that, though not shown in FIG. 16, a level shifter for further converting the voltage amplitude may be provided at a precedent stage to a buffer portion or the like near the pixel portion for the purpose of providing another means for converting the voltage amplitude, the power consumption inside the display device may be lowered.

Further, though an analog image signal is input to the display device illustrated in FIG. 16 according to this embodiment, the level shifter according to the present invention can also be applied to a driver circuit of a display device to which a digital image signal is input.

Embodiment 6

In this embodiment, a structure for, by using a level shifter with a differently structured differential circuit, obtaining the amplitude of GND-VDD2 without requiring a buffer is described.

Figure 17:
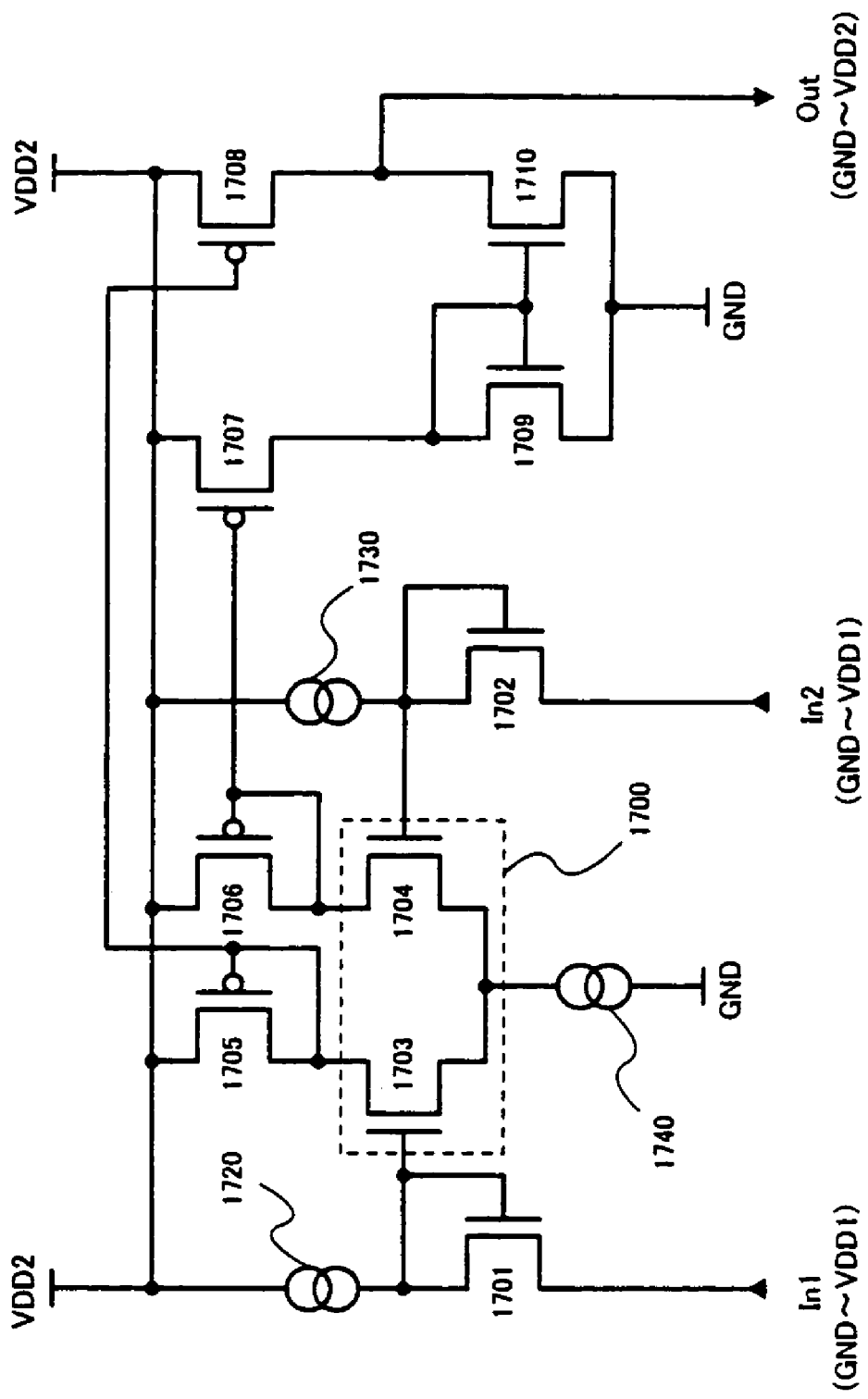
FIG. 17 is a circuit diagram of a level shifter having two input terminals and one output terminal of Example 6 according to the present invention.

FIG. 17 is an exemplary structure of a circuit of a level shifter of this embodiment according to the present invention. A differential circuit 1700 has TFTs 1703 and 1704. TFTs 1705 and 1708 form a first current mirror circuit while TFTs 1706 and 1707 form a second current mirror circuit.

Operation of the respective portions is now described with reference to FIG. 17 and FIGS. 18A to 18D. Similarly to the case of Embodiment 1, GND (=0 V), VDD1 (=3 V), and VDD2 (=10 V) are used as the power supply potentials in a simulation illustrated in FIGS. 18A to 18D. With regard to current sources in FIG. 17, constant current is secured by connecting the respective power supplies through TFTs and by controlling the potentials of gate electrodes of the respective TFTs.

First, two signals (In1 and In2) having the amplitude of GND-VDD1 are input from input terminals (FIG. 18A). Potentials between that of the above input signals and that of a power supply VDD2 are input to gate electrodes of the TFTs 1703 and 1704, respectively. These potentials are obtained by division by the resistances of the TFTs arranged for the current sources and of TFTs 1701 and 1702. Potentials at the gate electrodes of the TFTs 1703 and 1704 are represented as $V_{1703}$ and $V_{704}$, respectively (FIG. 18B).

$I_{740}=I_{1703}+I_{1704}$, wherein $I_{1740}$ is current through a current source 1740, $I_{1703}$ is current through the TFT 1703, and $I_{1704}$ is current through the TFT 1704. If $V_{1703}>V_{1704}$, then $I_{1703}>I_{1704}$. Therefore, currents through the TFTs 1705 and 1706 are the same as $I_{1703}$ and $I_{1704}$, respectively. Further, since the values of the current through the TFTs 1705 and 1706 are determined, the gate potentials of the TFTs 1705 and 1706 are also determined, which are represented as $V_{1705}$ and $V_{1706}$, respectively. Since the TFTs 1705 and 1708 form a current mirror circuit and the TFTs 1706 and 1707 form another current mirror circuit, the gate potentials of the TFTs 1707 and 1708 are determined by them. More specifically, $V_{1705}=V_{1708}$ and $V_{1706}=V_{1707}$. When the relationship between $V_{1703}$ and $V_{1704}$ is as mentioned above, it follows that $V_{1705}>V_{1706}$, and thus, $V_{1707}<V_{1708}$ (FIG. 18C).

According to the result of the simulation, as illustrated in FIG. 18C, $V_{1707}$ and $V_{1708}$ range from approximately 6.5 V to 9 V. When $V_{1707}$ is Hi, the TFT 1707 is in a nonconductive state. Therefore, gate potentials of TFTs 1709 and 1710 are lowered and the TFTs 1709 and 1710 are nonconductive. Here, $V_{1708}$ is Lo and the TFT 1708 is conductive. This results in VDD2 appearing at an output terminal. When $V_{1707}$ is Lo, the TFT 1707 is conductive. Therefore, gate potentials of the TFTs 1709 and 1710 are increased and the TFTs 1709 and 1710 are conductive. Here, $V_{1708}$ is Hi and the TFT 1708 is nonconductive. This results in GND appearing at the output terminal (FIG. 18D).

Though, in FIG. 17 according to this embodiment, the TFTs 1701 and 1702 are n-type TFTs, it may be that the TFTs 1701 and 1702 are p-type TFTs, gate electrodes and drain regions of the TFTs 1701 and 1702 are connected to the input terminal (In1 or In2), and source regions of the TFTs 1701 and 1702 are connected to current sources 1720 and 1730 and to an input portion of the differential circuit.

Embodiment 7

In the embodiment mode according to the present invention, as illustrated in FIG. 1, the input signals are input to the source regions of the TFTs 105 and 106. In this embodiment, a case where a different method of inputting signals is used is described.

Figure 19:
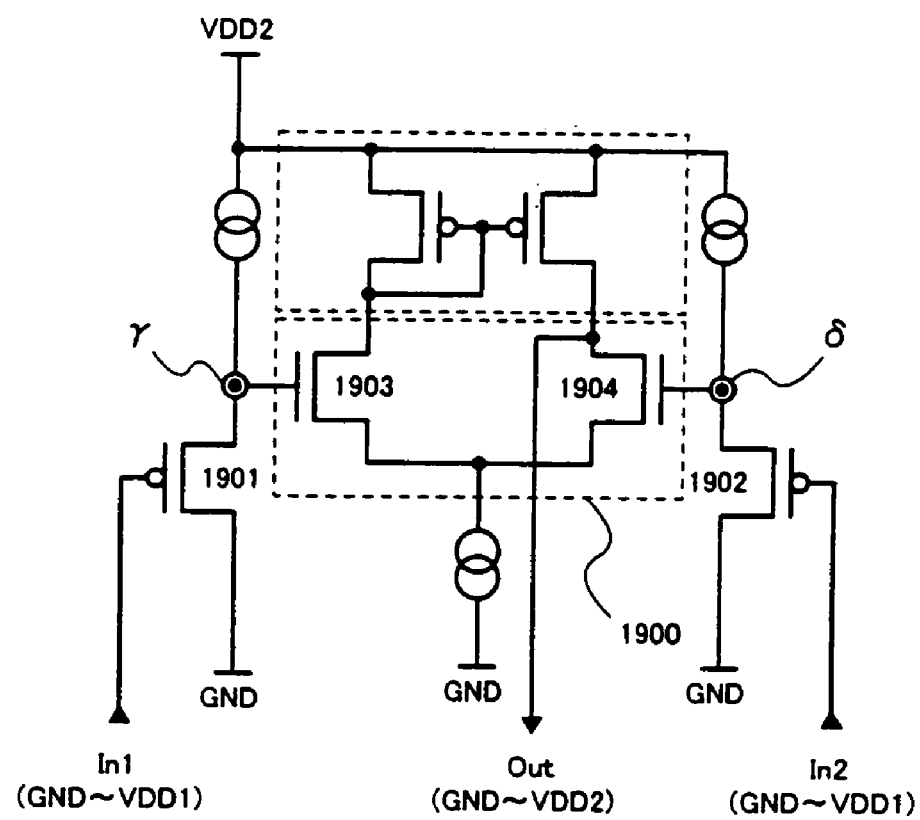
FIG. 19 is a circuit diagram of a level shifter having two input terminals and one output terminal of Example 7 according to the present invention.

FIG. 19 illustrates an exemplary structure of a circuit of the present embodiment. FIG. 19 is different from FIG. 1 only in the connection of TFTs arranged between the differential circuit and the input signals (In1 and In2). The n-type TFTs 105 and 106 to which In1 and In2 are connected in FIG. 1 are replaced by p-type TFTs 1901 and 1902, respectively, in FIG. 19, and the input signals are input to gate electrodes of the p-type TFTs 1901 and 1902, respectively.

Operation of a level shifter illustrated in FIG. 19 is now described in the following.

Voltage applied to a gate electrode of a TFT 1903 in the differential circuit, that is, potential at a node γ is considered. It is to be noted that, as described in the above, potential ranging from VDD2 to GND appears at the node γ.

First, when Hi is input as an input signal (In1), potential at the gate electrode of the p-type TFT 1901 is 3 V. The gate-source voltage of the p-type TFT 1901 here is represented as $V_{GS1}$. When Lo is input as the input signal (In1), potential at the gate electrode of the p-type TFT 1901 is 0 V. The gate-source voltage of the p-type TFT 1901 here is represented as $V_{GS2}$.

Here, $|V_{GS1}|<|V_{GS2}|$. $R_{Hi}>R_{Lo}$, wherein $R_{Hi}$ and $R_{Lo}$ are ON resistances of the TFT 1901 at the respective times. When the ON resistance of the TFT 1901 is low, the potential appearing at the node γ by dividing the voltage between VDD2 and GND by the resistances comes nearer to GND and is lowered. Conversely, when the ON resistance of the TFT 1901 is high, the potential appearing at the node γ comes nearer to VDD2 and is raised. Therefore, the voltage applied to the gate electrode of the p-type TFT 1903 oscillates with the same phase as that of the input signal (In1) and with certain amplitude. In a similar way, voltage applied to a gate electrode of a TFT 1904 in the differential circuit, that is, potential at a node δ, also oscillates with the same phase as that of the input signal (In2) and with certain amplitude. Therefore, the potential difference between the nodes γ and δ is amplified by a differential amplifier circuit and is outputted. After that, in a similar way as in the cases of the embodiment mode, Embodiment 1, and the like, a signal having the amplitude of 0-VDD2 is outputted.

Embodiment 8

A level shifter according to the present invention uses a constant current source, and current keeps flowing even when amplitude conversion of a signal is not carried out. In this embodiment, a method of lowering the power consumption in such a time period (more specifically, a retrace period where no low voltage amplitude signal is inputted. or the like) is described.

Figure 20:
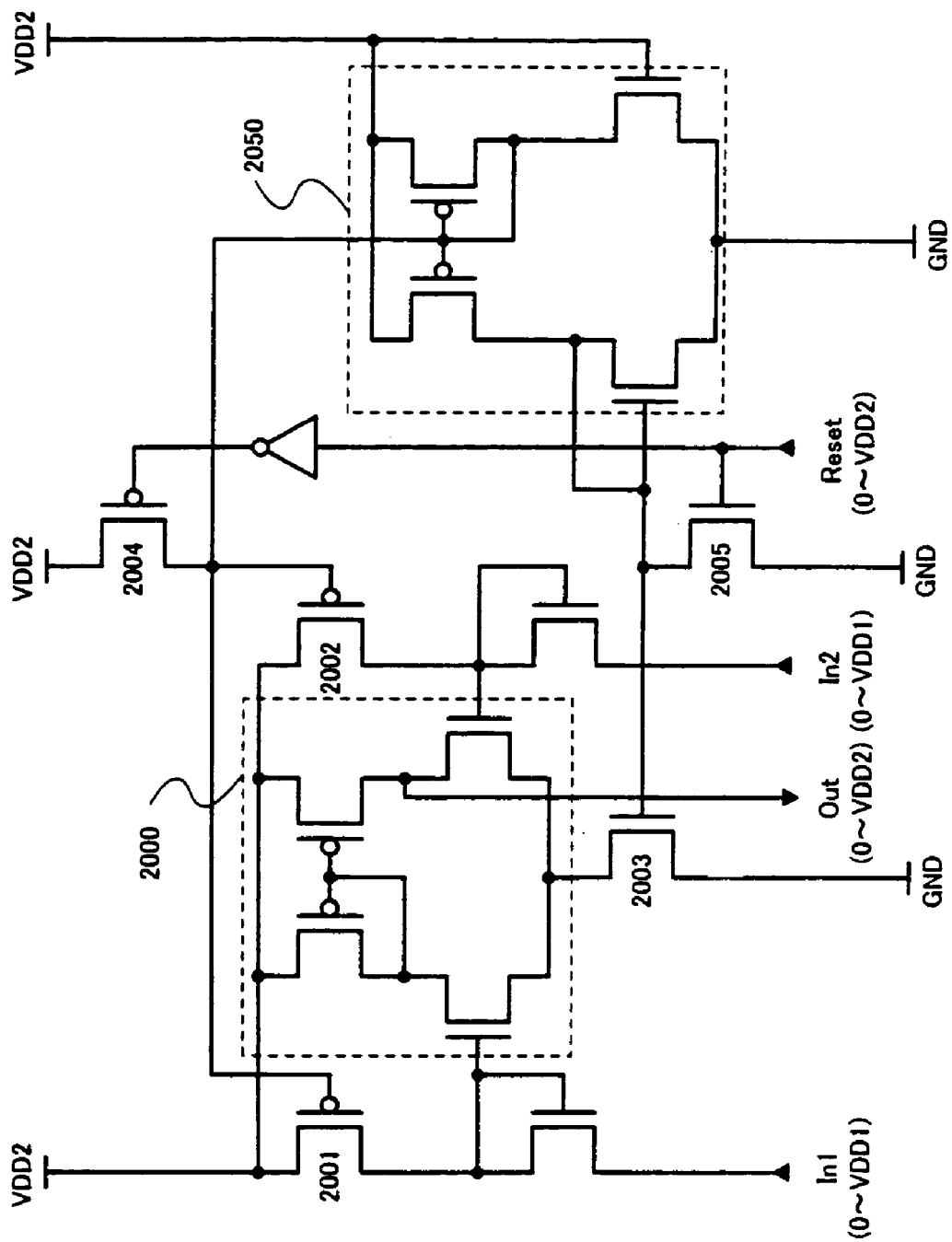
FIG. 20 is a circuit diagram of a level shifter having a reset signal input terminal of Example 8 according to the present invention.

As illustrated in FIG. 1, current is supplied to the level shifter from the three current sources 107, 108, and 109. In FIG. 20, the paths of current supply are controlled by TFTs 2001, 2002, and 2003, and a power supply portion 2050 supplies potentials to gate electrodes of the TFTs 2001, 2002, and 2003. Therefore, the simplest way to block current supply to the level shifter is to make the TFTs 2001, 2002, and 2003 in a nonconductive state. Accordingly, TFTs 2004 and 2005 for reset are arranged as illustrated in FIG. 20. In this example, a p-type TFT is used as the TFT 2004 for reset while an n-type TFT is used as the TFT 2005 for reset. A source region of the TFT 2004 is connected to a power supply VDD2, and a drain region of the TFT 2004 is connected to gate electrodes of the TFTs 2001 and 2002. A source region of the TFT 2005 is connected to a power supply GND, and a drain region of the TFT 2005 is connected to a gate electrode of the TFT 2003.

During a period where the level shifter is not operated such as a retrace period (hereinafter referred to as a reset period), a reset signal (having the voltage amplitude of, for example, 0 V-VDD2) is input to gate electrodes of the TFTs 2004 and 2005. When a circuit for reset structured as illustrated in FIG. 20 is provided, a Hi signal is input during a reset period. This makes the TFTs 2004 and 2005 to be conductive, makes the potential at the gate electrodes of the TFTs 2001 and 2002 to be VDD2, and makes the potential at the gate electrode of the TFT 2003 to be GND to make all the TFTs 2001, 2002, and 2003 in a nonconductive state. Therefore, current to the respective portions is blocked.

The channel widths of the TFTs 2004 and 2005 for reset are selected so as to be of a size having the current capacity to allow the gate-source voltages of the TFTs 2001, 2002, and 2003 to be sufficiently below the absolute values of their threshold values (specifically, the potential at the drain region of the TFT 2004 sufficiently approaches VDD2 and the potential at the drain region of the TFT 2005 sufficiently approaches GND).

Embodiment 9

In this embodiment, a case where current supply to a level shifter is blocked in a method different from the one used in Embodiment 8 is described.

Figure 22:
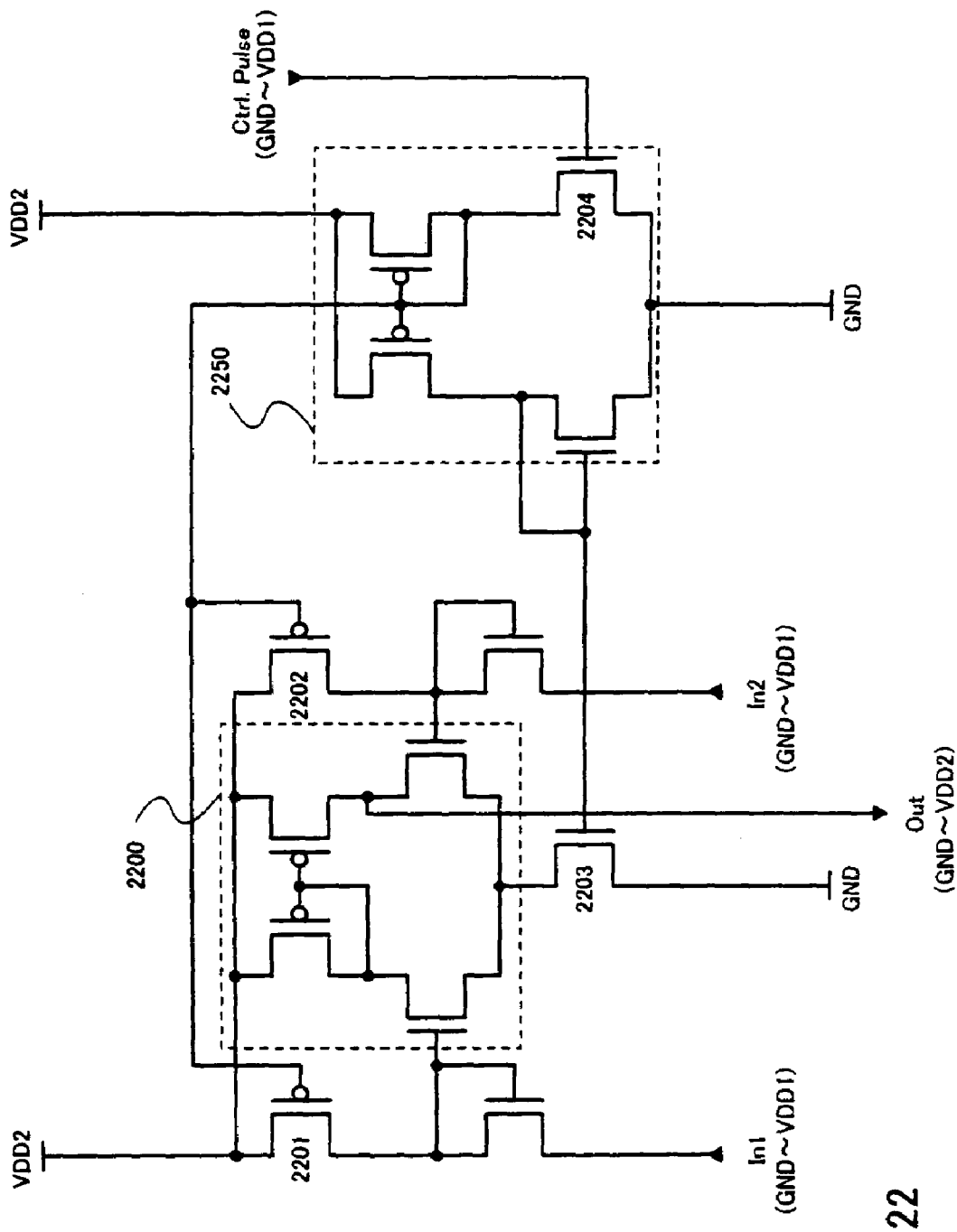
FIG. 22 is a circuit diagram of a level shifter having a power supply control signal input terminal of Example 9 according to the present invention.

In a circuit illustrated in previous embodiments, constant power supply potential is input to a gate electrode of a TFT 2204 in a power supply portion 2250 of the circuit shown in FIG. 22 to keep the TFT always in an ON state. On the other hand, in this embodiment, a power supply control pulse (Ctrl. Pulse) is input to the gate electrode of the TFT 2204.

In FIG. 22, since the TFT 2204 is an n-type TFT, when the potential of the power supply control pulse is Hi, the TFT 2204 is in the ON state to make the TFTs 2201 to 2203 on the side of the level shifter conductive. In other words, the power supply control pulse is input only during a period where the operation of converting the level is necessary such that current is supplied to the level shifter only during that period.

Embodiment 10

Figure 21:
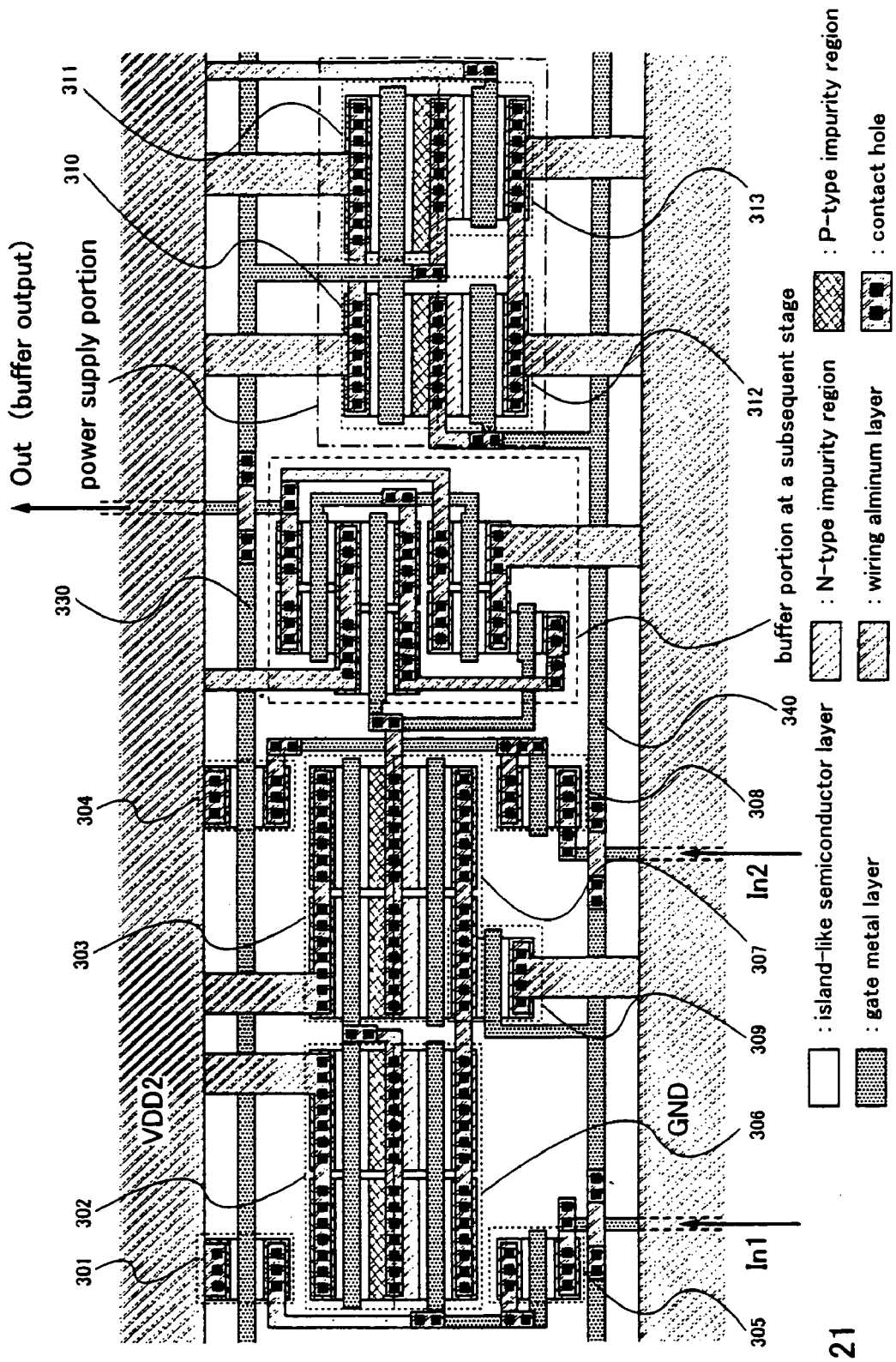
FIG. 21 illustrates an actually designed, exemplary arrangement of TFTs of level shifters of Example 10 according to the present invention taking into consideration of adjoining arrangement of the TFTs.

FIG. 21 illustrates an actual, exemplary arrangement of TFTs of level shifters according to the present invention applied to a display device. TFTs 301 to 309 in FIG. 21 correspond to the TFTs 301 to 309 in the circuit diagram of FIG. 3.

Though power supply portions are not illustrated in the example illustrated in FIG. 21, a plurality of level shifters are arranged in parallel and side by side. Potential to be supplied to gate electrodes of the TFTs 301, 304, and 309 connected to a current source is supplied from a power supply portion outside the parallelly arranged level shifters through signal lines 330 and 340 to the respective level shifters. The power supply portion may be commonly used by a plurality of level shifters.

It is to be noted that there is an insulating film between wiring aluminum, a gate metal, and a semiconductor layer such that there is no short circuit where they overlap with each other, and they are connected with one another at places where a contact hole is provided.

Operational characteristics of a differential circuit and a current mirror circuit used in the level shifter according to the present invention particularly require that the circuits have an extremely small variation in the characteristics of the TFTs forming the circuits. Therefore, it is preferable that the TFTs forming the circuits are adjoiningly arranged. Also, when the manufacturing process of the TFT substrate includes laser irradiation or the like, by the adjoining arrangement of the TFTs illustrated in FIG. 21, variation in the TFT characteristics due to uneven laser irradiation or the like can be decreased. In addition, since the above-described laser irradiation or the like is normally carried out in the form of linear irradiation, arranging the respective TFTs in parallel with one another further decreases the variation in the TFT characteristics due to uneven laser irradiation or the like. Thus, this arrangement is further preferable.

Embodiment 11

An active matrix type display device using a driver circuit which is formed along with the present invention have various usage. In this embodiment, the semiconductor device implemented the display device using a driver circuit which is formed along with the present invention.

The following can be given as examples of such electronic equipments: a portable information terminal (such as an electronic book, a mobile computer, or a mobile telephone), a video camera; a digital camera; a personal computer; a television and a projector device. Examples of those electronic equipments are shown in FIGS. 13, 14 and 15.

Figure 13A:
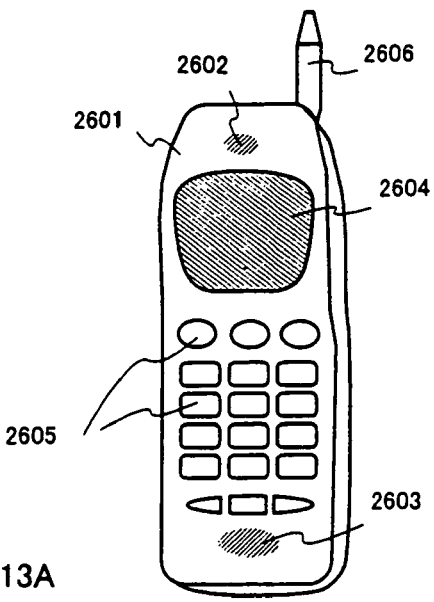
FIGS. 13A to 13F illustrate electronic equipment of Example 11 according to the present invention.

FIG. 13A is a portable telephone which includes a main body 2601, a voice output portion 2602, a voice input portion 2603, a display portion 2604, operation switches 2605, and an antenna 2606. The present invention can be applied to the display portion 2604.

Figure 13B:
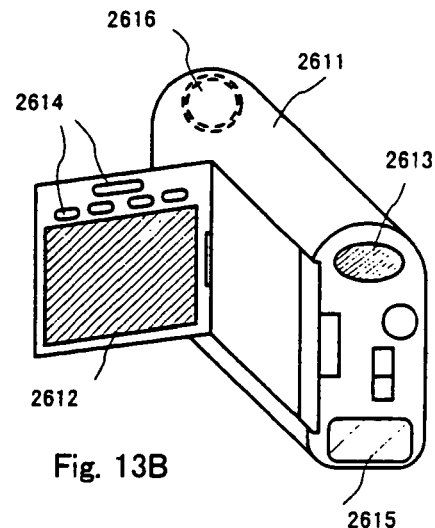

FIG. 13B illustrates a video camera which includes a main body 2611, a display portion 2612, an audio input portion 2613, operation switches 2614, a battery 2615, an image receiving portion 2616, or the like. The present invention can be applied to the display portion 2612.

Figure 13C:
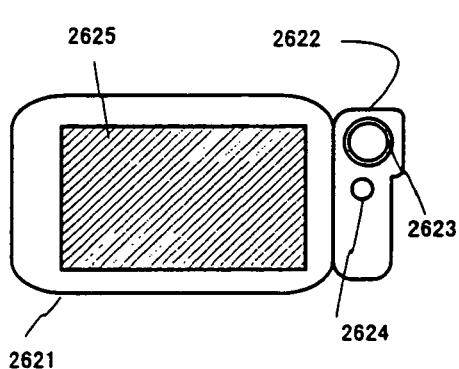

FIG. 13C illustrates a mobile computer or portable information terminal which includes a main body 2621, a camera section 2622, an image receiving section 2623, operation switches 2624, a display portion 2625, or the like. The present invention can be applied to the display portion 2625.

Figure 13D:
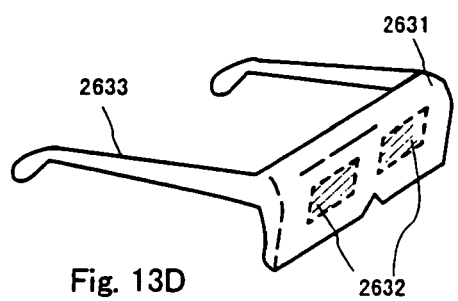

FIG. 13D illustrates a head mounted display which includes a main body 2631, a display portion 2632 and an arm portion 2633. The present invention can be applied to the display portion 2632.

Figure 13E:
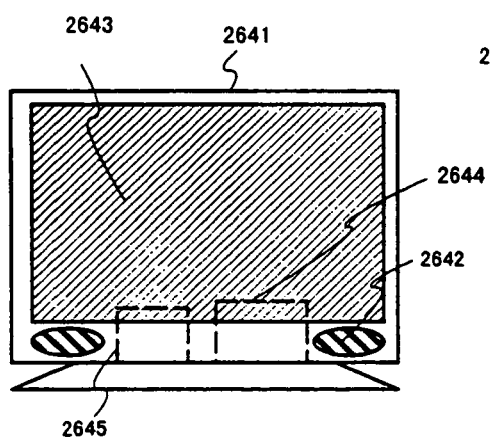

FIG. 13E illustrates a television which includes a main body 2641, a speaker 2642, a display portion 2643, an input device 2644 and an amplifier device 2645. The present invention can be applied to the display portion 2643.

Figure 13F:
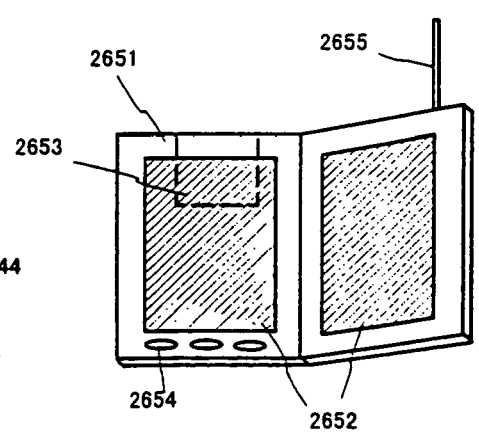

FIG. 13F illustrates a portable electronic book which includes a main body 2651, display portion 2652, a memory medium 2653, an operation switch 2654 and an antenna 2655 and the portable electronic displays a data recorded in mini disc (MD) and DVD (Digital Versatile Disc) and a data recorded by an antenna. The present invention can be applied to the display portions 2652.

FIG. 14A illustrates a personal computer which includes a main body 2701, an image input portion 2702, a display portion 2703, a key board 2704, or the like. The present invention can be applied to the display portion 2703.

FIG. 14B illustrates a player using a recording medium which records a program (hereinafter referred to as a recording medium) and includes a main body 2711, a display portion 2712, a speaker section 2713, a recording medium 2714, and operation switches 2715. This player uses DVD (digital versatile disc), CD, etc. for the recording medium, and can be used for music appreciation, film appreciation, games and Internet. The present invention can be applied to the display portion 2712.

FIG. 14C illustrates a digital camera which includes a main body 2721, a display portion 2722, a view finder portion 2723, operation switches 2724, and an image receiving section (not shown in the figure). The present invention can be applied to the display portion 2722.

FIG. 14D illustrates a one-eyed head mounted display which includes a main body 2731 and band portion 2732. The present invention can be applied to the display portion 2731.

FIG. 15A is a front type projector which includes a projection device 2801, display device 2802, a light source 2803, an optical system 2804 and a screen 2805. Further a single plate type can be used for a projection device 2801 and a three plate type, which corresponds to the light of R, G, and B respectively, can be used. The present invention can be applied to the display device 2802.

FIG. 15B is a rear type projector which includes a main body 2811, a projection device 2812, a display device 2813, a light source 2814, an optical system 2815, a reflector 2816 and a screen 2817. Further a single plate type can be used for a projection device 2813 and a three plate type, which corresponds to the light of R, G, and B respectively, can be used. The present invention can be applied to the display device 2813.

FIG. 15C is a diagram which shows an example of the structure of the projection devices 2801 and 2812 of FIGS. 15A and 15B. The projection devices 2801 and 2812 comprise: an optical light source system 2821; mirrors 2822 and 2824 to 2826; a dichroic mirror 2823; a prism 2827; a display device 2828; a phase differentiating plate 2829; and a projection optical system 2830. The projection optical system 2830 comprises a plurality of optical lenses having a projection lens. Though the present embodiment shows an example of 3-plate type, the present invention is not limited to this example and a single plate type may be used for instance. Further, an operator may appropriately dispose an optical lens, a film which has a function to polarize light, a film which adjusts a phase difference and an IR film, etc in the optical path shown by an arrow in FIG. 15C.

FIG. 15D is a diagram showing an example of a structure of the optical light source system 2821 of FIG. 15C. In the present embodiment the optical light source system 2821 comprises: a reflector 2831; a light source 2832; lens arrays 2833; a polarizer conversion element 2834; and a condenser lens 2835. Note that the optical light source system shown in FIG. 15D is merely an example and the structure is not limited to this example. For instance, an operator may appropriately dispose an optical lens, a film which has a function to polarize light, a film which adjusts a phase difference and an IR film, etc.

The level shifter having the differential amplifier circuit according to the present invention can provide a sufficient converting capability even when the voltage amplitude of an input signal is low. This makes it possible to normally convert the amplitude of a signal even when the driving voltage of the driver circuit is lowered and the difference in the driving voltage between the driver circuit and the pixel portion is large.

Further, according to an example of the present invention, the level shifter is structured such that a signal is not directly input to a gate electrode. Since influence of the threshold of a TFT is decreased when the voltage amplitude of the input signal is low, the present invention greatly contributes to lower driving voltage of a driver circuit in the future.

What is claimed is:

1. A semiconductor device having a level shifter, the level shifter comprising:
   a current minor circuit;
   a differential circuit having the current mirror circuit as a load;
   a current source for supplying current to the differential circuit;

first and second source follower circuits; and first and second input nodes, wherein the first input node is electrically connected to the first source follower circuit, wherein the first source follower circuit is electrically connected to the differential circuit, wherein the second input node is electrically connected to the second source follower circuit, and wherein the second source follower circuit is electrically connected to the differential circuit.

2. A semiconductor device according to claims 1, wherein a first input signal from the first input node is a signal having a low voltage amplitude, and a second input signal from the second input node is a signal having a low voltage amplitude and in an opposite phase to that of the first input signal.

3. A semiconductor device according to claim 1, wherein a first input signal from the first input node is a signal having a low voltage amplitude and a second input signal from the second input node is a signal having a constant potential in a range of the amplitude of the first input signal.

4. A semiconductor device according to claim 1, wherein voltage amplitude of each of a first input signal from the first input node and a second input signal from the second input node is 5V or lower.

5. An electronic equipment having the semiconductor device according to claim 1, wherein the electronic equipment is selected from the group consisting of a portable telephone, a mobile computer, a video camera, a head mounted display, a television, a portable electric book, a personal computer, a player, a digital camera, a one-eyed head mounted display, a front type projector, and a rear type projector.

6. A semiconductor device having a level shifter, the level shifter comprising:

a current mirror circuit;

a differential circuit having the current mirror circuit as a load;

a first current source for supplying current to the differential circuit;

a first transistor having a first gate electrode and a first drain region being electrically connected to each other;

a second transistor having a second gate electrode and a second drain region being electrically connected to each other;

second and third current sources for supplying current to the first and second transistors, respectively; and first and second input nodes, wherein the first input node is electrically connected to a first source region of the first transistor, wherein the first transistor is electrically connected to the differential circuit, wherein the second input node is electrically connected to a second source region of the second transistor, and wherein the second transistor is electrically connected to the differential circuit.

7. A semiconductor device according to claims 6, wherein a first input signal from the first input node is a signal having a low voltage amplitude, and a second input signal from the second input node is a signal having a low voltage amplitude and in an opposite phase to that of the first input signal.

8. A semiconductor device according to claim 6, wherein a first input signal from the first input node is a signal having a low voltage amplitude and a second input signal from the second input node is a signal having a constant potential in a range of the amplitude of the first input signal.

9. A semiconductor device according to claim 6, wherein voltage amplitude of each of a first input signal from the first input node and a second input signal from the second input node is 5V or lower.

10. An electronic equipment having the semiconductor device according to claim 6, wherein the electronic equipment is selected from the group consisting of a portable telephone, a mobile computer, a video camera, a head mounted display, a television, a portable electric book, a personal computer, a player, a digital camera, a one-eyed head mounted display, a front type projector, and a rear type projector.

11. A semiconductor device having a level shifter, the level shifter comprising:

a current mirror circuit;

a differential circuit having the current mirror circuit as a load;

a first current source for supplying current to the differential circuit;

a first transistor having a first gate electrode and a first drain region being electrically connected to each other;

a second transistor having a second gate electrode and a second drain region being electrically connected to each other;

second and third current sources for supplying current to the first and second transistors, respectively;

first and second input nodes, and first and second output nodes, wherein the differential circuit comprises third and fourth transistors, wherein the first drain region of the first transistor and a third gate electrode of the third transistor are electrically connected to each other, wherein the second drain region of the second transistor and a fourth gate electrode of the fourth transistor are electrically connected to each other, wherein the first input node is electrically connected to a first source region of the first transistor, wherein the first output node is electrically connected to a third gate electrode of the third transistor, wherein second input node is electrically connected to a second source region of the second transistor, and wherein the second output node is electrically connected to a fourth gate electrode of the fourth transistor.

12. A semiconductor device according to claims 11, wherein a first input signal from the first input node is a signal having a low voltage amplitude, and a second input signal from the second input node is a signal having a low voltage amplitude and in an opposite phase to that of the first input signal.

13. A semiconductor device according to claim 11, wherein a first input signal from the first input node is a signal having a low voltage amplitude and a second input signal from the second input node is a signal having a constant potential in a range of the amplitude of the first input signal.

14. A semiconductor device according to claim 11, wherein voltage amplitude of each of a first input signal from the first input node and a second input signal from the second input node is 5V or lower.

15. An electronic equipment having the semiconductor device according to claim 11, wherein the electronic equipment is selected from the group consisting of a portable telephone, a mobile computer, a video camera, a head mounted display, a television, a portable electric book, a personal computer, a player, a digital camera, a one-eyed head mounted display, a front type projector, and a rear type projector.

16. A semiconductor device having a level shifter, the level shifter comprising:
a first transistor of a first conductive type, having a first gate electrode and a first drain region thereof being electrically connected to each other;
a second transistor of the first conductive type, having a second gate electrode and a second drain region thereof being electrically connected to each other;
a differential circuit comprising a third transistor of the first conductive type and a fourth transistor of the first conductive type;
a current minor circuit comprising a fifth transistor of a second conductive type and a sixth transistor of the second conductive type, the a fifth gate electrode and a fifth drain region of the fifth transistor being connected to each other;
a seventh transistor of the first conductive type for electrically connecting the differential circuit and a first current source;
an eighth transistor of the second conductive type for electrically connecting the fifth transistor and a second current source;
a ninth transistor of the second conductive type for electrically connecting the sixth transistor and a third current source;
a power supply portion for supplying potential to gate electrodes of the seventh, eighth, and ninth transistors; and
first and second input nodes,
wherein the first input node is electrically connected to a first source region of the first transistor,
wherein the first transistor is electrically connected to a third gate electrode of the third transistor,
wherein the second input node is electrically connected to a second source region of the second transistor, and
wherein the second transistor is electrically connected to a fourth gate electrode of the fourth transistor.

17. A semiconductor device according to claims 16, wherein a first input signal from the first input node is a signal having a low voltage amplitude, and a second input signal from the second input node is a signal having a low voltage amplitude and in an opposite phase to that of the first input signal.

18. A semiconductor device according to claim 16, wherein a first input signal from the first input node is a signal having a low voltage amplitude and a second input signal from the second input node is a signal having a constant potential in a range of the amplitude of the first input signal.

19. A semiconductor device according to claim 16, wherein voltage amplitude of each of a first input signal from the first input node and a second input signal from the second input node is 5V or lower.

20. An electronic equipment having the semiconductor device according to claim 16, wherein the electronic equipment is selected from the group consisting of a portable telephone, a mobile computer, a video camera, a head mounted display, a television, a portable electric book, a personal computer, a player, a digital camera, a one-eyed head mounted display, a front type projector, and a rear type projector.

21. A semiconductor device having a level shifter, the level shifter comprising:
first and second current minor circuits;
a differential circuit electrically connected to the first and second current mirror circuits;
a first current source for supplying current to the differential circuit;
a first transistor having a first gate electrode and a first drain region being electrically connected to each other;
a second transistor having a second gate electrode and a second drain region being electrically connected to each other;
second and third current sources for supplying current to the first and second transistors, respectively; and
first and second input node,
wherein the first input node is electrically connected to a first source region of the first transistor,
wherein the first transistor is electrically connected to the differential circuit,
wherein the second input node is electrically connected to a second source region of the second transistor, and
wherein the second transistor is electrically connected to the differential circuit.

22. A semiconductor device according to claims 21, wherein a first input signal from the first input node is a signal having a low voltage amplitude, and a second input signal from the second input node is a signal having a low voltage amplitude and in an opposite phase to that of the first input signal.

23. A semiconductor device according to claim 21, wherein a first input signal from the first input node is a signal having a low voltage amplitude and a second input signal from the second input node is a signal having a constant potential in a range of the amplitude of the first input signal.

24. A semiconductor device according to claim 21, wherein voltage amplitude of each of a first input signal from the first input node and a second input signal from the second input node is 5V or lower.

25. An electronic equipment having the semiconductor device according to claim 21, wherein the electronic equipment is selected from the group consisting of a portable telephone, a mobile computer, a video camera, a head mounted display, a television, a portable electric book, a personal computer, a player, a digital camera, a one-eyed head mounted display, a front type projector, and a rear type projector.

26. A semiconductor device having a level shifter, the level shifter comprising:
first and second current mirror circuits;
a differential circuit electrically connected to the first and second current mirror circuits;
a first current source for supplying current to the differential circuit;
a first transistor having a first gate electrode and a first drain region being electrically connected to each other;
a second transistor having a second gate electrode and a second drain region being electrically connected to each other;
second and third current sources for supplying current to the first and second transistors, respectively; and
first and second input nodes,
wherein the differential circuit comprises third and fourth transistors,
wherein the first drain region of the first transistor and a third gate electrode of the third transistor are electrically connected to each other,
wherein a second drain region of the second transistor and a fourth gate electrode of the fourth transistor are electrically connected to each other, wherein the first input node is electrically connected to a first source region of the first transistor, wherein the first transistor is electrically connected to a third gate electrode of the third transistor;

wherein the second input node is electrically connected to a second source region of the second transistor, and wherein the second transistor is electrically connected to a fourth gate electrode of the fourth transistor.

27. A semiconductor device according to claims 26, wherein a first input signal from the first input node is a signal having a low voltage amplitude, and a second input signal from the second input node is a signal having a low voltage amplitude and in an opposite phase to that of the first input signal.

28. A semiconductor device according to claim 26, wherein a first input signal from the first input node is a signal having a low voltage amplitude and a second input signal from the second input node is a signal having a constant potential in a range of the amplitude of the first input signal.

29. A semiconductor device according to claim 26, wherein voltage amplitude of each of a first input signal from the first input node and a second input signal from the second input node is 5V or lower.

30. An electronic equipment having the semiconductor device according to claim 26, wherein the electronic equipment is selected from the group consisting of a portable telephone, a mobile computer, a video camera, a head mounted display, a television, a portable electric book, a personal computer, a player, a digital camera, a one-eyed head mounted display, a front type projector, and a rear type projector.

31. A semiconductor device having a level shifter, the level shifter comprising:
a current mirror circuit;
a differential circuit having the current mirror circuit as a load;
a first current source for supplying current to the differential circuit;
first and second source follower circuits;
a transistor for reset; and
first and second input nodes,
wherein the first input node is electrically connected to the first source follower circuit,
wherein a first output node of the first source follower circuit is electrically connected to the differential circuit,
wherein the second input node is electrically connected to the second source follower circuit,
wherein a second output node of the second source follower circuit is electrically connected to the differential circuit, and
wherein current supply by the first current source is blocked by a reset signal input to the transistor for reset, during a period where voltage amplitude of an input signal is not converted.

32. A semiconductor device according to claims 31, wherein a first input signal from the first input node is a signal having a low voltage amplitude, and a second input signal from the second input node is a signal having a low voltage amplitude and in an opposite phase to that of the first input signal.

33. A semiconductor device according to claim 31, wherein a first input signal from the first input node is a signal having a low voltage amplitude and a second input signal from the second input node is a signal having a constant potential in a range of the amplitude of the first input signal.

34. A semiconductor device according to claim 31, wherein voltage amplitude of each of a first input signal from the first in input node and a second input signal from the second input node is 5V or lower.

35. An electronic equipment having the semiconductor device according to claim 31, wherein the electronic equipment is selected from the group consisting of a portable telephone, a mobile computer, a video camera, a head mounted display, a television, a portable electric book, a personal computer, a player, a digital camera, a one-eyed head mounted display, a front type projector, and a rear type projector.

36. A semiconductor device having a level shifter, the level shifter comprising:
a current mirror circuit;
a differential circuit having the current mirror circuit as a load;
a first current source for supplying current to the differential circuit;
a first transistor having a first gate electrode and a first drain region being electrically connected to each other;
a second transistor having a second gate electrode and a second drain region being electrically connected to each other;
second and third current sources for supplying current to the first and second transistors, respectively; and
first and second input nodes,
wherein the first input node is electrically connected to a first source region of the first transistor,
wherein the first transistor is electrically connected to the differential circuit,
wherein the second input node is electrically connected to a second source region of the second transistor,
wherein the second transistor is electrically connected to the differential circuit, and
wherein current supply by the first, second, and third current sources is blocked during a period where voltage amplitude of an input signal is not converted.

37. A semiconductor device according to claims 36, wherein a first input signal from the first input node is a signal having a low voltage amplitude, and a second input signal from the second input node is a signal having a low voltage amplitude and in an opposite phase to that of the first input signal.

38. A semiconductor device according to claim 36, wherein a first input signal from the first input node is a signal having a low voltage amplitude and a second input signal from the second input node is a signal having a constant potential in a range of the amplitude of the first input signal.

39. A semiconductor device according to claim 36, wherein voltage amplitude of each a first input signal from the first input node and a second input signal from the second input node is 5V or lower.

40. A An electronic equipment having the semiconductor device according to claim 36, wherein the electronic equipment is selected from the group consisting of a portable telephone, a mobile computer, a video camera, a head mounted display, a television, a portable electric book, a personal computer, a player, a digital camera, a one-eyed head mounted display, a front type projector, and a rear type projector.

41. A semiconductor device having a level shifter, the level shifter comprising:

a first transistor of a first conductive type, having a first gate electrode and a first drain region thereof being connected to each other;

a second transistor of the first conductive type, having a second gate electrode and a second drain region thereof being connected to each other;

a differential circuit comprising a third transistor of the first conductive type and a fourth transistor of the first conductive type;

a current mirror circuit comprising a fifth transistor of a second conductive type having a fifth gate electrode and a fifth drain region being electrically connected to each other, and a sixth transistor of the second conductive type;

a seventh transistor of the first conductive type for connecting the differential circuit and a first current source;

an eighth transistor of the second conductive type for electrically connecting the fifth transistor and a second current source;

a ninth transistor of the second conductive type for electrically connecting the sixth transistor and a third current source;

a power supply portion for supplying potential to gate electrodes of the seventh, eighth, and ninth transistors;

a tenth transistor for reset of the second conductive type;

a eleventh transistor for reset of the first conductive type; and first and second input nodes, wherein the first drain region of the first transistor and a third gate electrode of the third transistor are electrically connected to each other, wherein the second drain region of the second transistor and a fourth gate electrode of the fourth transistor are electrically connected to each other, wherein a tenth source region of the tenth transistor for reset is electrically connected to seventh and eighth source regions of the seventh and eighth transistors, and a tent drain region of the tenth transistor for reset is electrically connected to seventh and eighth gate electrodes of the seventh and eighth transistors, wherein an eleventh source region of the eleventh transistor for reset is electrically connected to a ninth source region of the ninth transistor, and an eleventh drain region of the eleventh transistor for reset is electrically connected to a ninth gate electrode of the ninth transistor, wherein the first input node is electrically connected to a first source region of the first transistor, wherein the first transistor is electrically connected to the third gate electrode of the third transistor, wherein the second input node is electrically connected to a second source region of the second transistor, wherein the second transistor is electrically connected to the fourth gate electrode of the fourth transistor, and wherein during a period where voltage amplitude of an input signal is not converted, current supply is blocked by a reset signal input to the tenth and eleventh transistors for reset, and by making the seventh, eighth, and ninth transistors in a nonconductive state.

42. A semiconductor device according to claims 41, wherein a first input signal from the first input node is a signal having a low voltage amplitude, and a second input signal from the second input node is a signal having a low voltage amplitude and in an opposite phase to that of the first input signal.

43. A semiconductor device according to claim 41, wherein a first input signal from the first input node is a signal having a low voltage amplitude and a second input signal from the second input node is a signal having a constant potential in a range of the amplitude of the first input signal.

44. A semiconductor device according to claim 41, wherein voltage amplitude of each of a first input signal from the first input node and a second input signal from the second input node is 5V or lower.

45. A An electronic equipment having the semiconductor device according to claim 41, wherein the electronic equipment is selected from the group consisting of a portable telephone, a mobile computer, a video camera, a head mounted display, a television, a portable electric book, a personal computer, a player, a digital camera, a one-eyed head mounted display, a front type projector, and a rear type projector.

* * * * *